(12) United States Patent
Fukaya et al.

(10) Patent No.: US 7,410,834 B2
(45) Date of Patent: Aug. 12, 2008

(54) METHOD OF MANUFACTURING A SEMICONDUCTOR DEVICE

(75) Inventors: Syuudai Fukaya, Nanae (JP); Toshiyuki Shinya, Hakodate (JP); Hajime Hasebe, Hakodate (JP)

(73) Assignee: Renesas Technology Corp., Tokyo (JP)

( * ) Notice: Subject to any disclaimer, the term of this patent is extended or adjusted under 35 U.S.C. 154(b) by 300 days.

(21) Appl. No.: 11/002,804

(22) Filed: Dec. 3, 2004

(65) Prior Publication Data
US 2005/0139982 A1    Jun. 30, 2005

(30) Foreign Application Priority Data
Dec. 25, 2003    (JP)    ............................. 2003-430092

(51) Int. Cl.
  *H01L 21/00*    (2006.01)
(52) U.S. Cl. ................. 438/123; 257/E21.51
(58) Field of Classification Search ................. 438/123; 257/E21.51
See application file for complete search history.

(56) References Cited

U.S. PATENT DOCUMENTS

| 6,452,255 B1 * | 9/2002 | Bayan et al. | ................. 257/666 |
| 6,608,366 B1 * | 8/2003 | Fogelson et al. | ............. 257/666 |
| 2004/0058479 A1 * | 3/2004 | Matsuura et al. | ............. 438/123 |

FOREIGN PATENT DOCUMENTS

JP    2000-299400    10/2000

* cited by examiner

*Primary Examiner*—Lex Malsawma
(74) *Attorney, Agent, or Firm*—Miles & Stockbridge P.C.

(57) ABSTRACT

A semiconductor device improved in packaging reliability is disclosed. Each of leads used in the semiconductor device has a first surface positioned between a main surface of a resin sealing body and a back surface opposite to the main surface of the resin sealing body, a second surface positioned on the side opposite to the first surface and exposed from the back surface of the resin sealing body, a first end face positioned on a semiconductor chip side, a second end face positioned on the side opposite to the first end face and exposed from a side face of the resin sealing body, and a recessed portion depressed from the second surface to the first surface side and contiguous to the second end face, the second surface and an inner wall surface of the recessed portion being covered with a plating layer which is higher in solder wettability than the second end face of each of the leads.

23 Claims, 30 Drawing Sheets

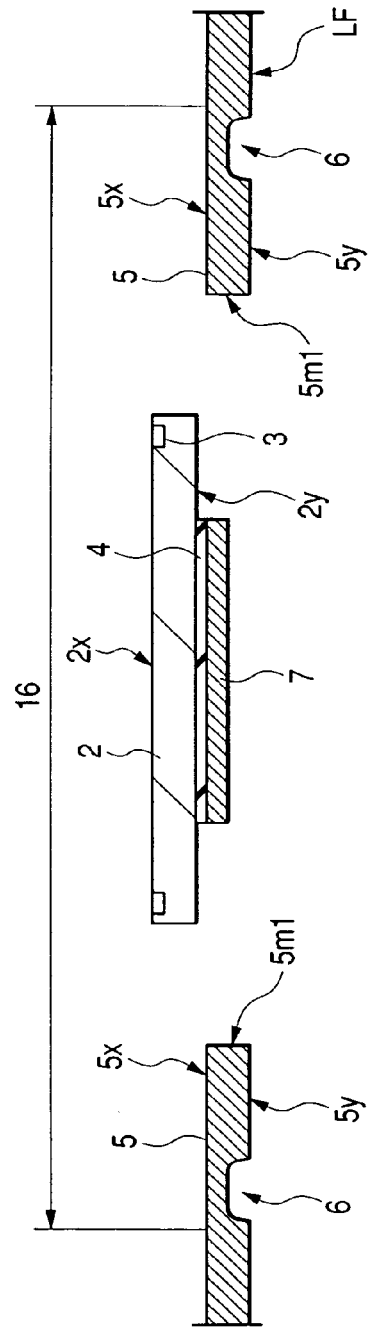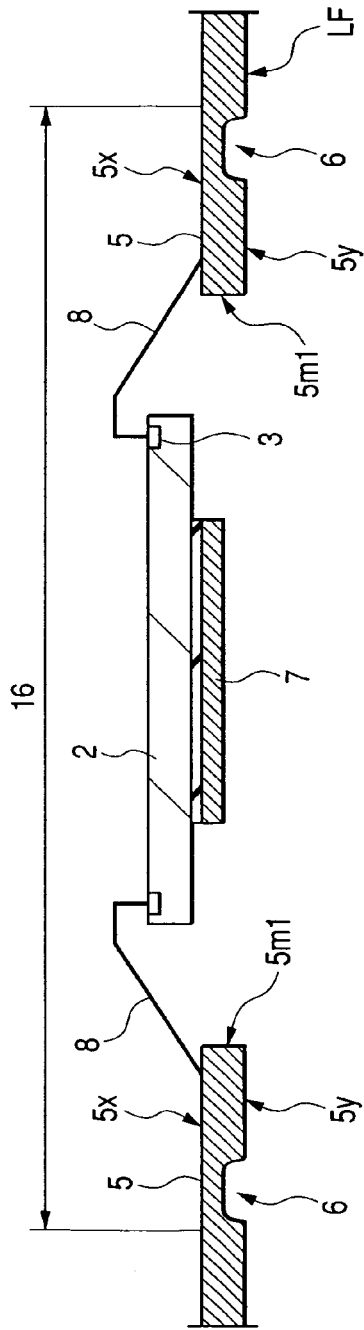
FIG. 12(a)
FIG. 12(b)

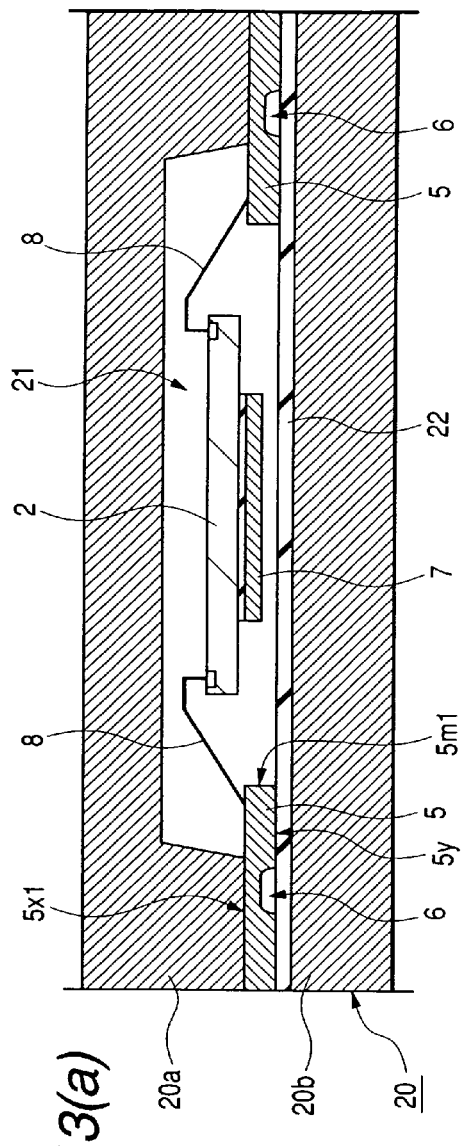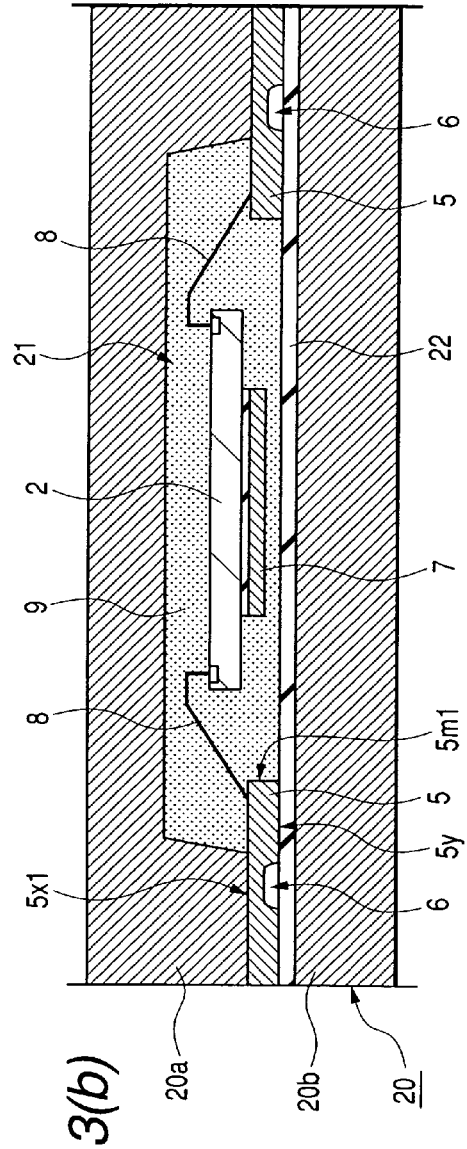

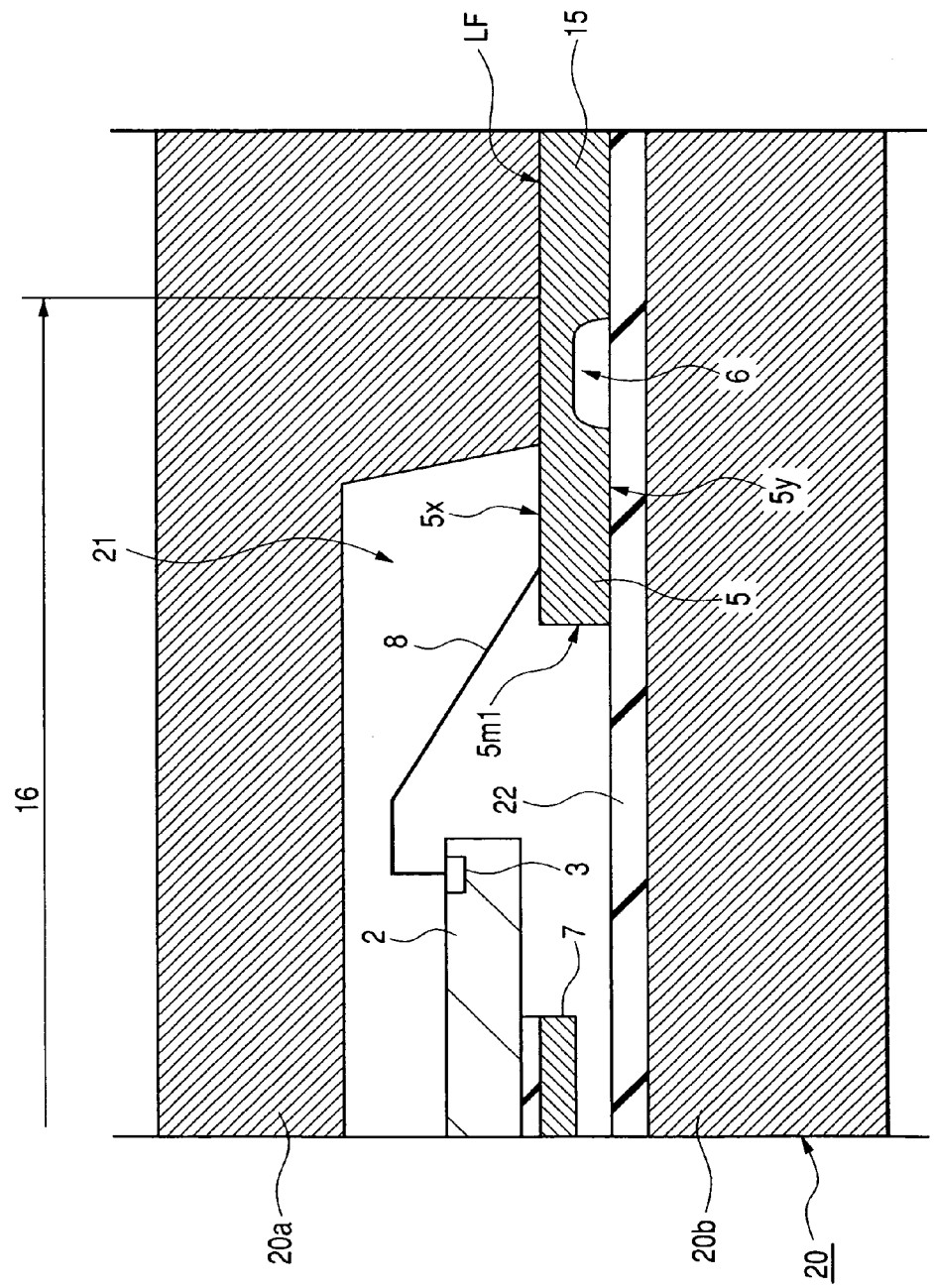

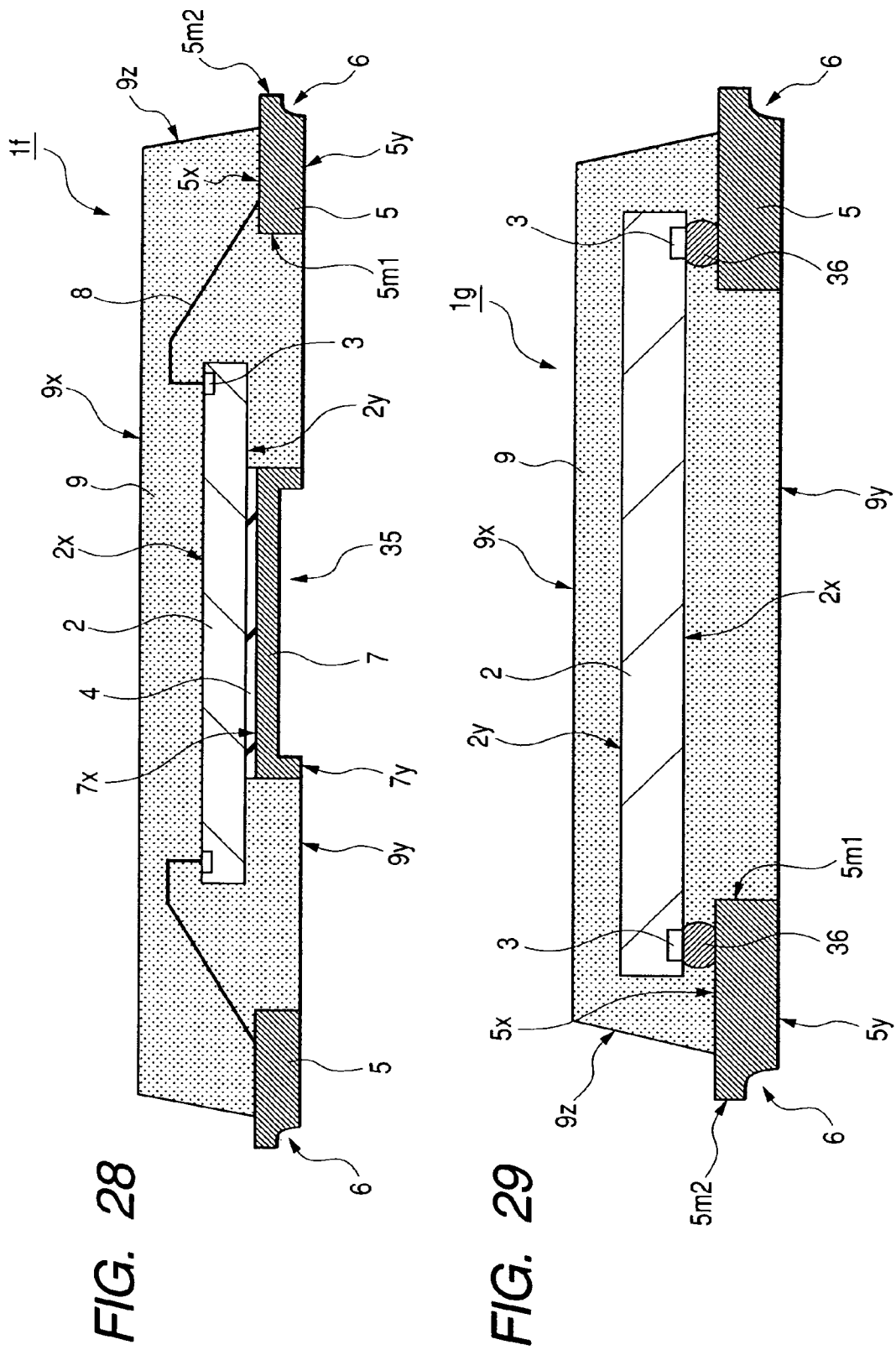

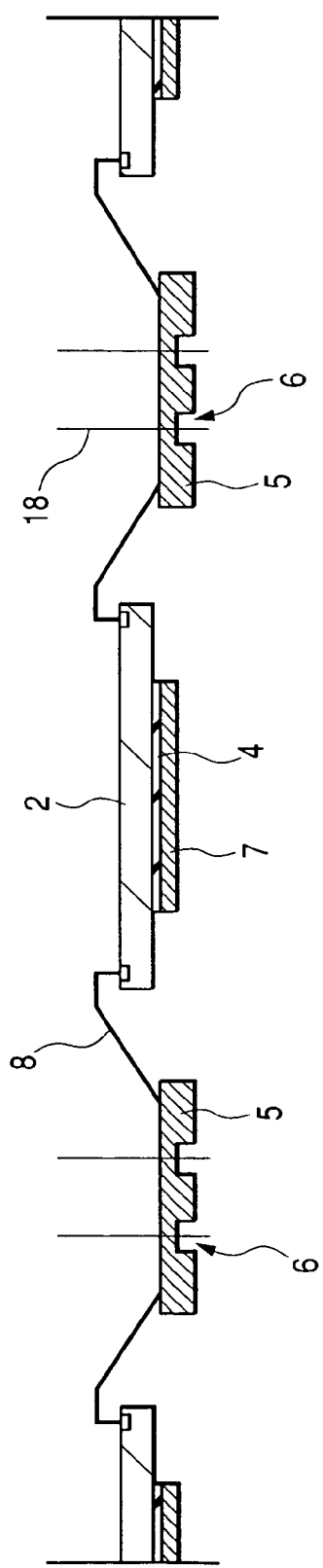 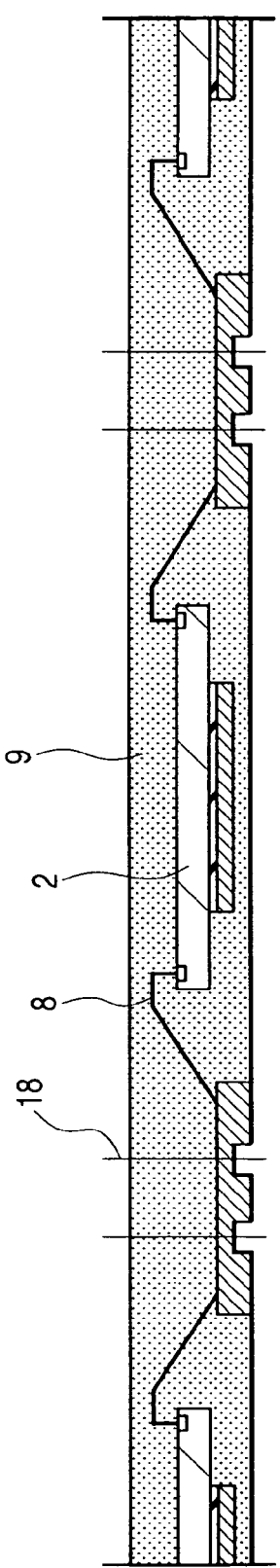
FIG. 34(a)
FIG. 34(b)

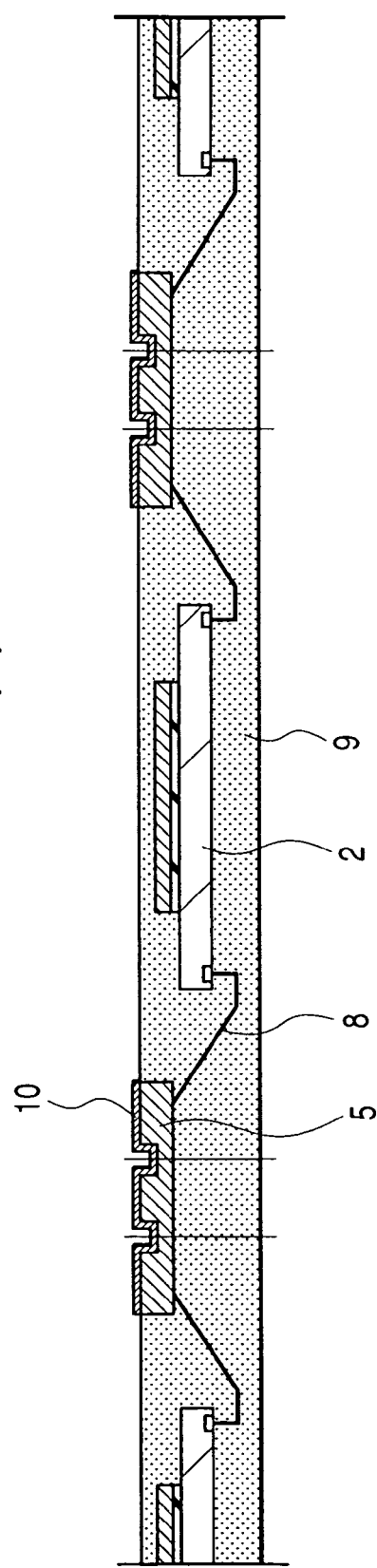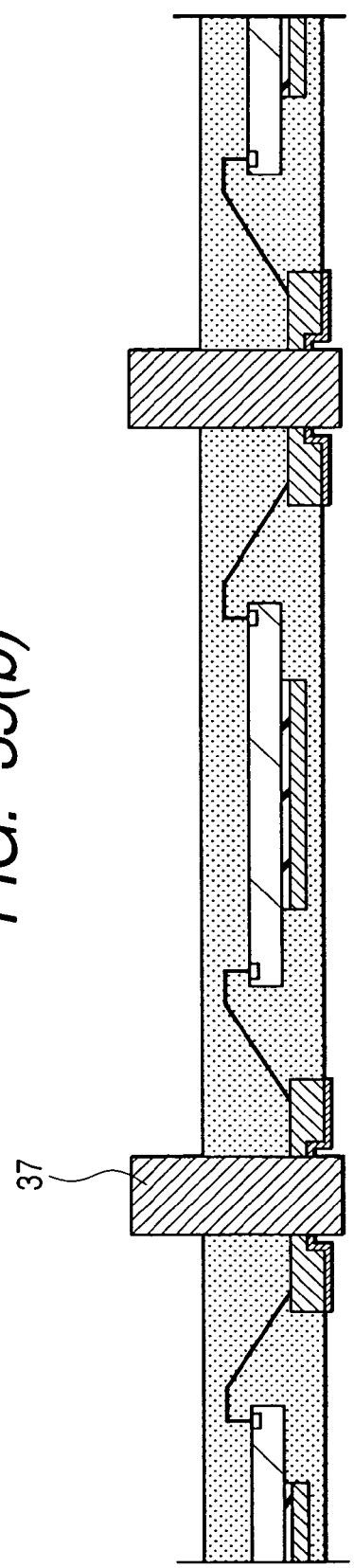

METHOD OF MANUFACTURING A SEMICONDUCTOR DEVICE

CROSS-REFERENCE TO RELATED APPLICATION

The present application claims priority from Japanese patent application No. 2003-430092 filed on Dec. 25, 2003, the content of which is hereby incorporated by reference into this application.

BACKGROUND OF THE INVENTION

The present invention relates to a semiconductor device and a method of manufacturing the same. Particularly, the present invention relates to a technique applicable effectively to a non-leaded semiconductor device.

As semiconductor devices in which a semiconductor chip with an integrated circuit mounted thereon is sealed with resin, those of various package structures have been proposed and are available commercially. Among them, for example a semiconductor device called QFN (Quad Flat Non-Leaded Package) type is known. The QFN type semiconductor device has a package structure in which leads connected electrically to electrodes formed on a semiconductor chip are exposed as external connecting terminals from a back surface of a resin sealing body. Therefore, a planar size thereof can be reduced in comparison with a semiconductor device of a package structure in which leads connected electrically to electrodes formed on a semiconductor chip are projected from side faces of a resin sealing body and are bent in a predetermined shape, for example a semiconductor-device called QFP (Quad Flat Package) type.

A lead frame is used in manufacturing the QFN type semiconductor device. The lead frame is fabricated by punching a metallic sheet with a precision press or by etching the metallic sheet into a predetermined pattern. The lead frame has plural product forming areas partitioned by a frame body which includes an outer frame portion and an inner frame portion. In each product forming area are disposed a chip support (tab, die pad, chip mounting portion) for mounting a semiconductor chip thereon and plural leads whose one end portions face around the chip support. The chip support is supported by suspending leads extending from a frame body of the lead frame. Opposite end portions opposite to one end portions of the leads are supported by the frame body of the lead frame.

In fabricating the QFN type semiconductor device with use of such a lead frame, a semiconductor chip is fixed to the chip support of the lead frame, then electrodes formed on the semiconductor chip and the leads are electrically connected with each other through conductive wires, thereafter the semiconductor chip, wires, chip support and suspending leads are sealed with resin to form a resin sealing body, and subsequently unnecessary portions of the lead frame are cut off.

The resin sealing body in the QFN type semiconductor device is formed by a transfer molding method which is suitable for mass production. According to the transfer molding method, the resin sealing body is formed by positioning the lead frame between upper and lower dies of a molding die in such a manner that the semiconductor chip, leads, chip support, suspending leads and bonding wires are disposed in the interior of a cavity (resin fill portion) of the molding die, and by subsequent injection of a thermosetting resin into the cavity.

As to the QFN type semiconductor device, it is disclosed for example in Japanese Unexamined Patent Publication No. 2000-299400.

[Patent Literature 1]
Japanese Unexamined Patent Publication
No. 2000-299400

SUMMARY OF THE INVENTION

With the recent tendency to reducing the thickness and size of electric devices, a demand for the reduction in thickness and size now exists also for the QFN type semiconductor device incorporated in portable devices such as portable telephones and digital cameras.

Reduction in size (planar size) of the QFN type semiconductor device can be attained by shortening the distance between side faces of a semiconductor chip and side faces of a resin sealing body. However, for shortening the distance, it is necessary to shorten the length of each lead, with the result that the length of a terminal portion (soldered portion) for external connection of each lead also becomes short. Consequently, the area of bonding between each lead and a solder material at the time of soldering the semiconductor device to a wiring substrate becomes small and the bonding strength between electrode pads (lands, foot print) formed on a wiring substrate and the leads of the semiconductor device becomes low, so that the possibility of occurrence of a packaging defect such as peeling of the semiconductor device from the wiring substrate becomes high.

On the other hand, also in the QFN type semiconductor device, for ensuring the wettability of solder at the time of soldering the semiconductor device to a wiring substrate, a plating layer higher in solder wettability than the second end face of each lead is formed on the terminal portion for external connection of each lead. However, generally in fabricating the QFN type semiconductor device, plating is performed after the formation of a resin sealing body and leads are cut after the plating. Therefore, a plating layer is not formed on the end face of each lead projecting from a side face of the resin sealing body (the end face on the side opposite to the chip-side end face).

Taking note of the plating layer on each lead, the present inventors have made studies about the strength of bonding between electrode pads formed on a wiring substrate and terminal portions for external connection of leads. As a result, we accomplished the present invention.

It is an object of the present invention to provide a technique able to improve the packaging reliability of a semiconductor device.

It is another object of the present invention to provide a technique able to attain the reduction in size of a semiconductor device.

The above and other objects and novel features of the present invention will become apparent from the following description and the accompanying drawings.

Typical modes of the present invention as disclosed herein will be outlined below.

The semiconductor device of the present invention comprises:

a semiconductor chip, the semiconductor chip having a main surface and a back surface positioned on mutually opposite sides and further having a plurality of electrodes disposed on the main surface;

a plurality of leads electrically connected respectively to a plurality of electrodes formed on the semiconductor chip; and a resin sealing body for sealing the semiconductor chip and the plural leads, wherein each of the plural leads has a first surface positioned between a main surface of the resin sealing body and a back surface of the resin sealing body opposite to the main surface, a second surface positioned on the side opposite to the first surface and exposed from the back surface of the resin sealing body, a first end face positioned on the semiconductor chip side, a second end face positioned on the side opposite to the first end face and projecting from a side face of the resin sealing body, and a recessed portion depressed from the second surface to the first surface side and contiguous to the second end face, and wherein the second surface and a wall surface of the recessed portion are covered with a plating layer which is higher in solder wettability than the second end face of the lead.

According to the above means, when soldering the semiconductor device onto a wiring substrate, solder wets and gets onto the second end face of each lead, so that the area of bonding between the lead and the solder material increases and hence the strength of bonding between electrodes pads formed on the wiring substrate and the leads of the semiconductor device increases. As a result, the packaging reliability of the semiconductor device can be improved.

Besides, since the area of bonding between each lead and the solder material increased to a degree corresponding to the depth of the recessed portion and the strength of bonding between the electrode pads of the wiring substrate and the leads of the semiconductor device increase, it is possible to further improve the packaging reliability of the semiconductor device.

Further, since the solder material wets and gets onto the second end face of each lead, the area of bonding between the lead and the solder material increases and the area of bonding between the lead and the solder material increases to a degree corresponding to the depth of the recessed portion. Therefore, even if the length of the second surface of each lead becomes shorter with the reduction in size of the semiconductor device, it is possible to suppress the occurrence of a packaging defect such as peeling of the semiconductor device from the wiring substrate. That is, the reduction in size of the semiconductor device can be attained while ensuring the packaging reliability.

The following is a brief description of effects obtained by typical modes of the present invention as disclosed herein.

According to the present invention it is possible to improve the packaging reliability of the semiconductor device.

According to the present invention it is possible to attain the reduction in size of the semiconductor device.

BRIEF DESCRIPTION OF THE DRAWINGS

FIGS. 4(a) and 4(b) show an internal structure of the semiconductor device of the first embodiment, of which FIG. 4(a) is a schematic plan view with an upper portion of a resin sealing body removed and FIG. 4(b) is a schematic sectional view taken along line a-a in FIG. 4(a);

FIGS. 12(a) and 12(b) show manufacturing steps for manufacturing the semiconductor device of the first embodiment, of which FIG. 12(a) is a schematic sectional view showing a chip mounting step and FIG. 12(b) is a schematic sectional view showing a wire bonding step;

FIGS. 13(a) and 13(b) show a resin sealing step subsequent to FIG. 12 in a manufacturing process for the semiconductor device, of which FIG. 13(a) is a schematic sectional view showing a positioned state of the lead frame within a molding die and FIG. 13(b) is a schematic sectional view showing a resin-sealed state;

FIG. 14 is a partially enlarged, schematic sectional view of FIG. 13(a);

FIG. 28 is a schematic sectional view taken along line c-c in FIG. 27;

FIG. 29 is a schematic sectional view showing an internal structure of a semiconductor device according to a seventh embodiment of the present invention;

FIGS. 30(a) and 30(b) show an internal structure of a semiconductor device according to an eighth embodiment of the present invention, of which FIG. 30(a) is a schematic plan view with an upper portion of a resin sealing body removed and FIG. 30(b) is a schematic sectional view taken along line d-d in FIG. 30(a);

FIGS. 34(a) and 34(b) show manufacturing steps for the semiconductor device of the eighth embodiment, of which FIG. 34(a) is a schematic sectional view showing a wire bonding step and FIG. 34(b) is a schematic sectional view showing a resin sealing step;

FIGS. 35(a) and 35(b) show semiconductor device manufacturing steps subsequent to FIG. 34, of which FIG. 35(a) is a schematic sectional view showing a plating step and FIG. 35(b) is a schematic sectional view showing a cutting step;

DETAILED DESCRIPTION OF THE PREFERRED EMBODIMENTS

Figure 1:
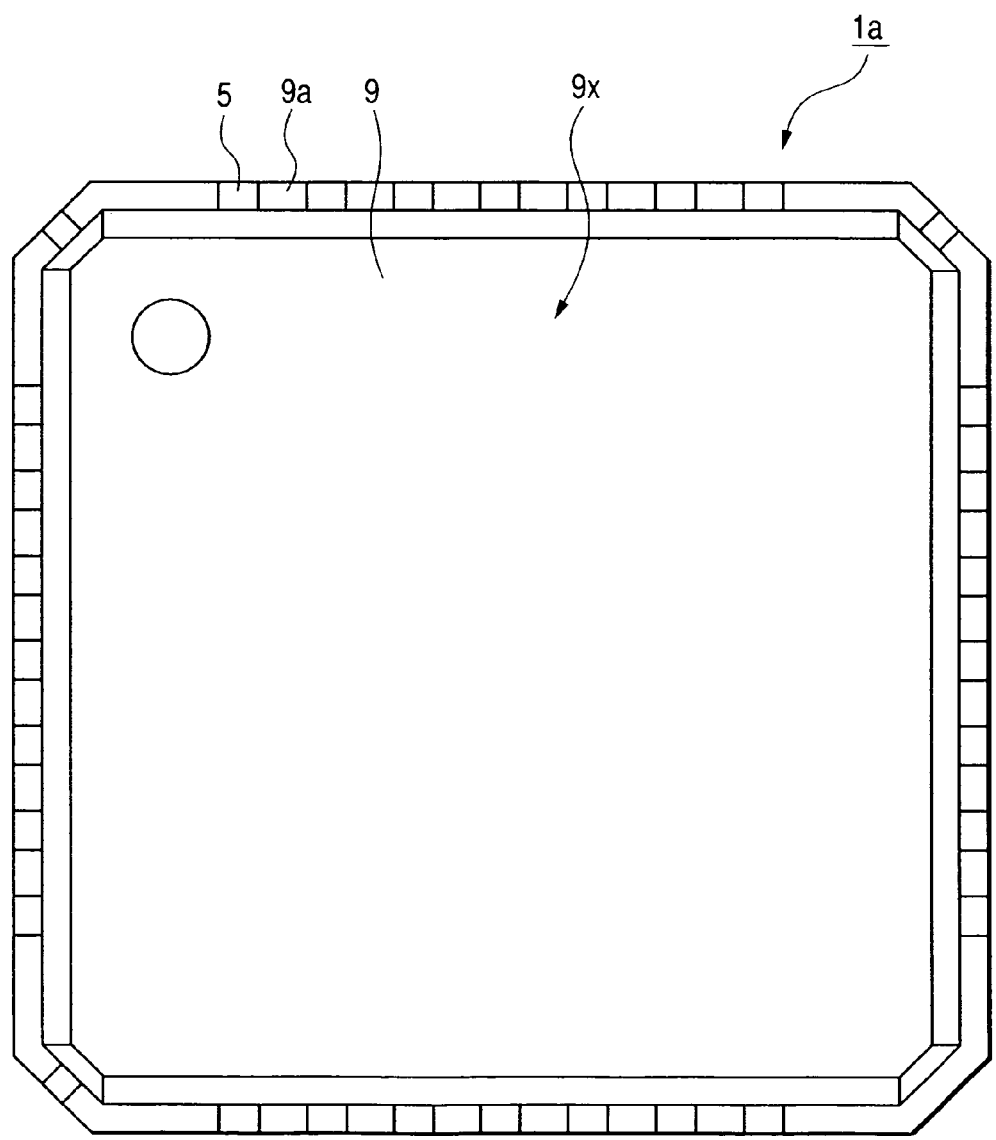
FIG. 1 is a schematic plan view (top view) showing an appearance structure of a semiconductor device according to a first embodiment of the present invention

Embodiments of the present invention will be described in detail hereinunder with reference to the accompanying drawings. In all of the drawings for explaining the embodiments, portions having like functions are identified by like reference numerals, and repeated explanations thereof will be omitted.

First Embodiment

In this first embodiment, reference will be made to an example of application of the present invention to a QFN type semiconductor device as a non-leaded semiconductor device in which leads are partially exposed as terminal portions for external connection to a back surface of a resin sealing body.

Figure 2:
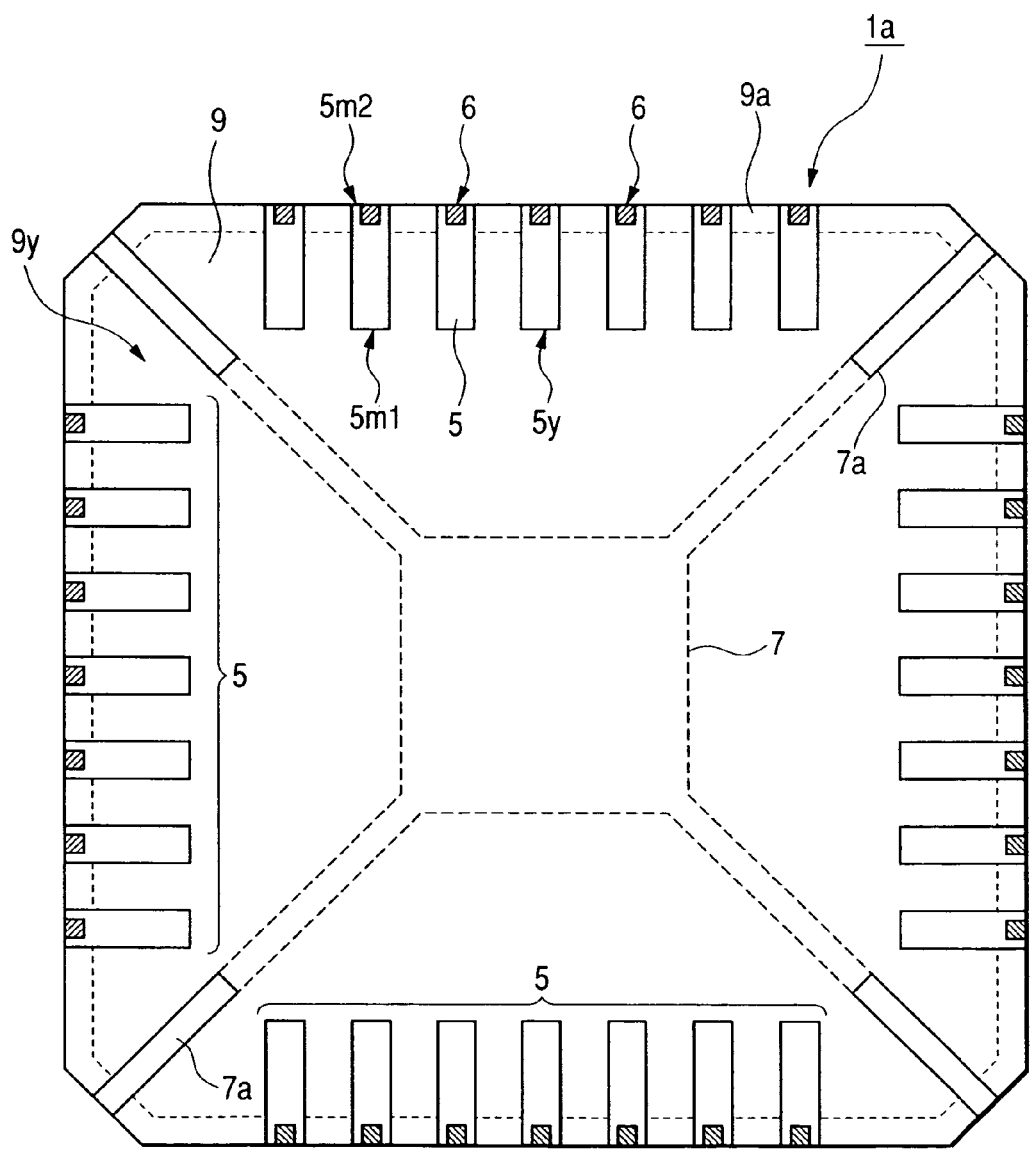
FIG. 2 is a schematic bottom view (underside view) thereof.
Figure 3:
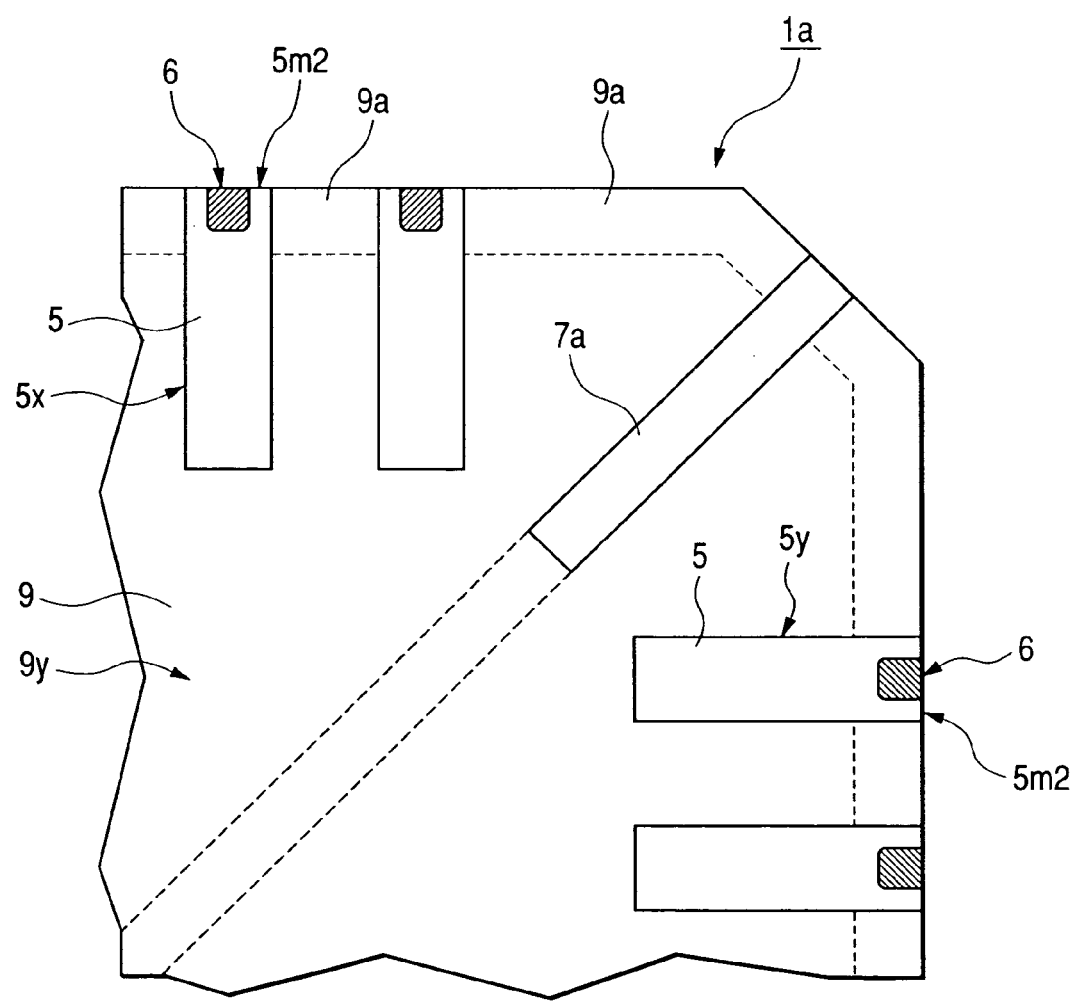
FIG. 3 is a partially enlarged, schematic bottom view of FIG. 2.
Figure 4A:
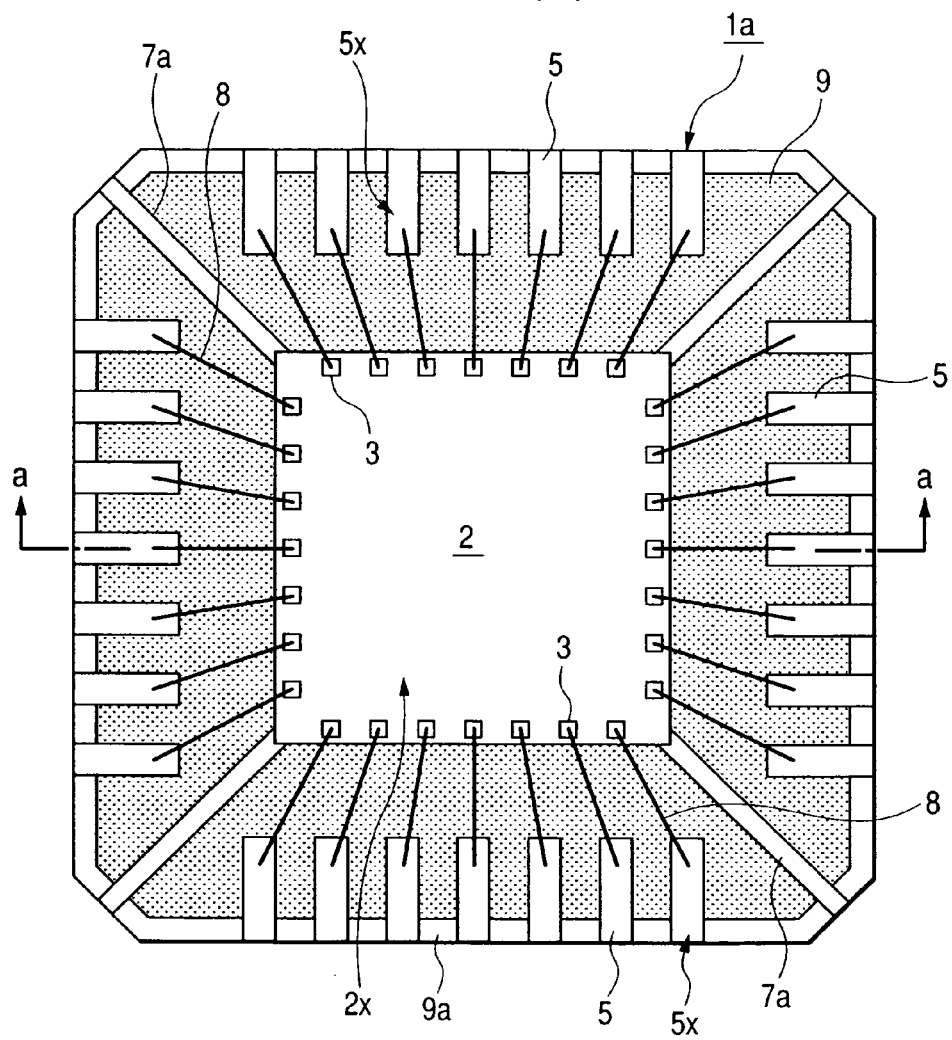
Figure 4B:
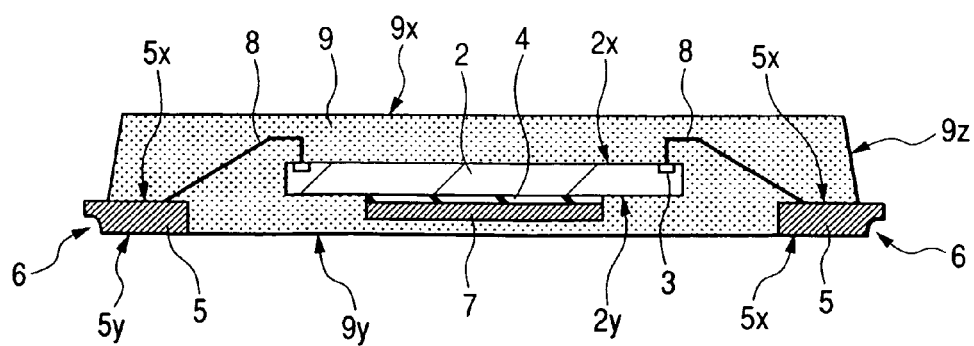
Figure 5:
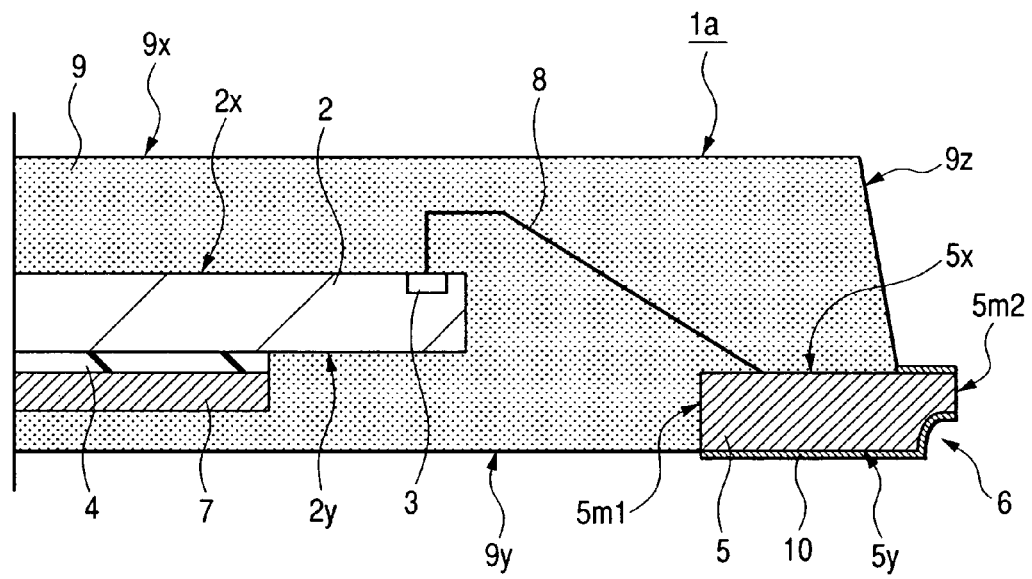
FIG. 5 is a partially enlarged, schematic sectional view of FIG. 4(b)
Figure 6:
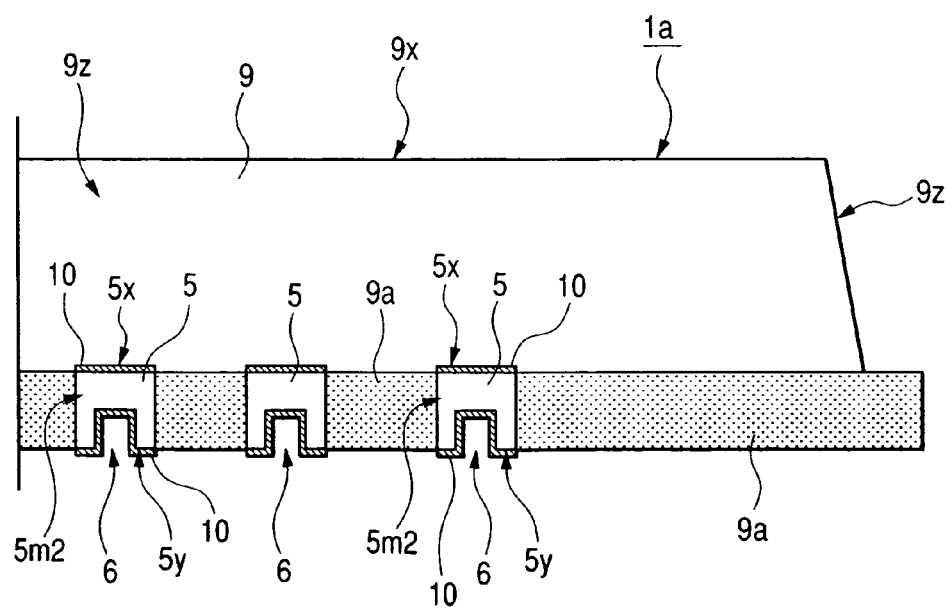
FIG. 6 is a schematic side view showing a part of the appearance structure of the semiconductor device of the first embodiment.
Figure 7:
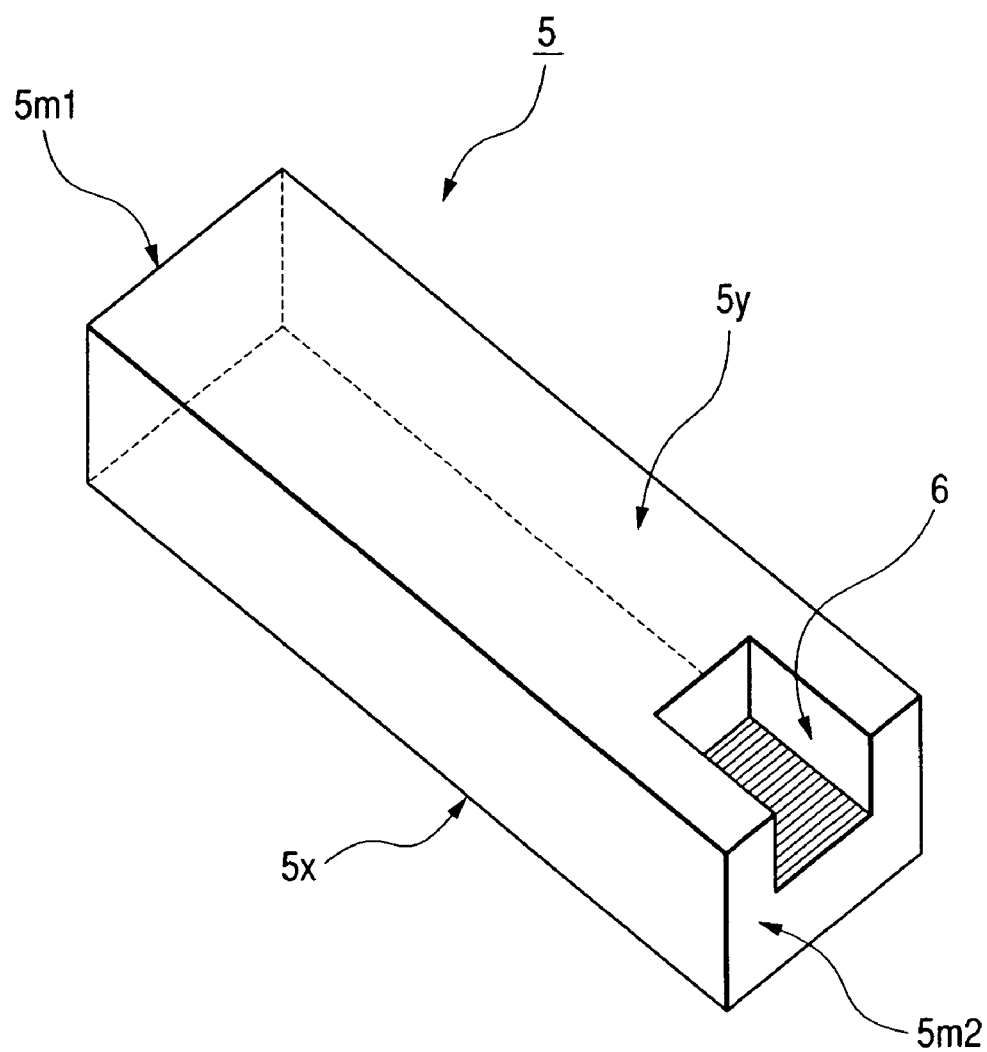
FIG. 7 is a schematic perspective view showing a back surface of a lead in FIG. 5.
Figure 8:
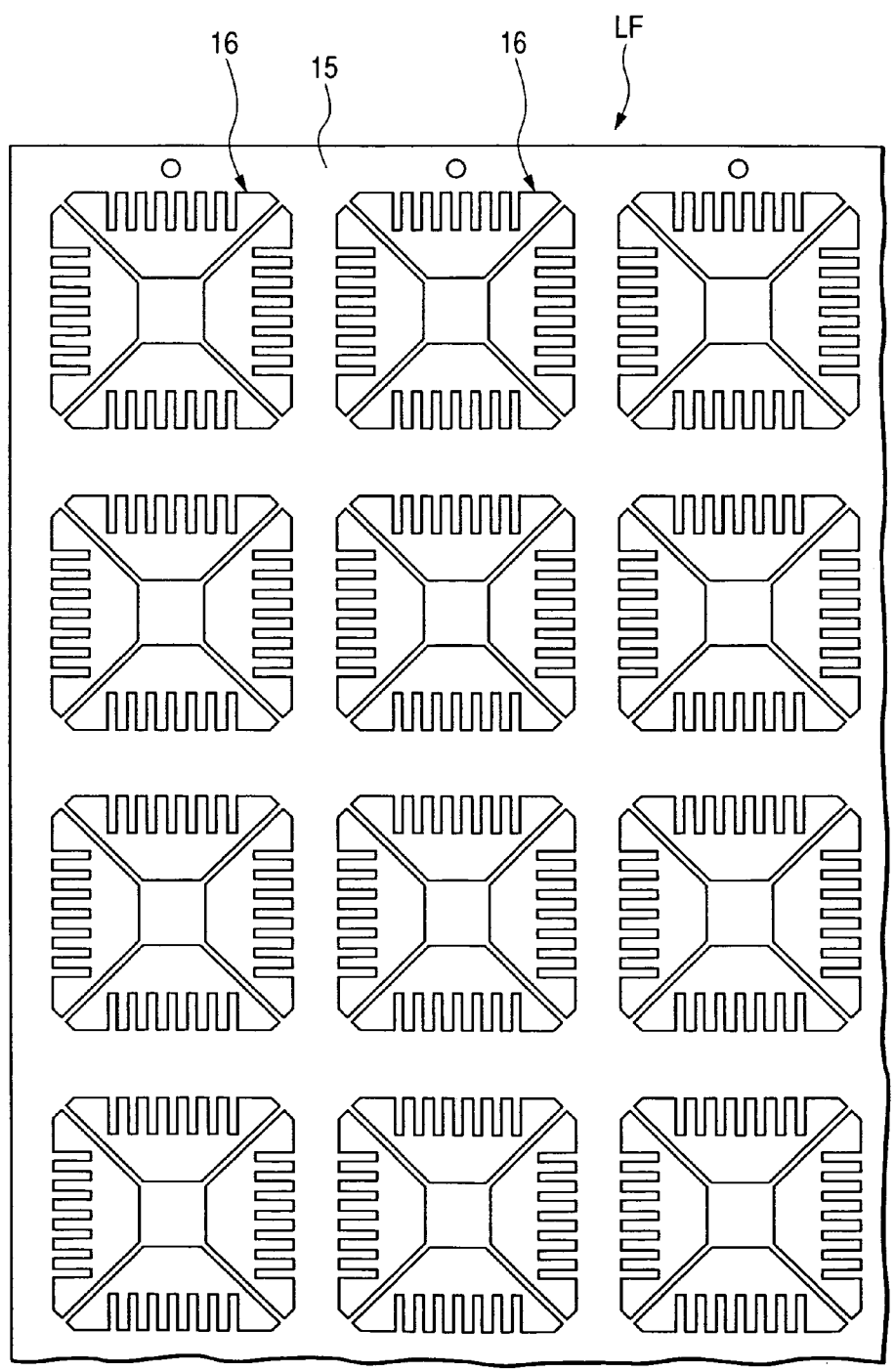
FIG. 8 is a schematic plan view showing a part of a lead frame used in manufacturing the semiconductor device of the first embodiment.
Figure 9:
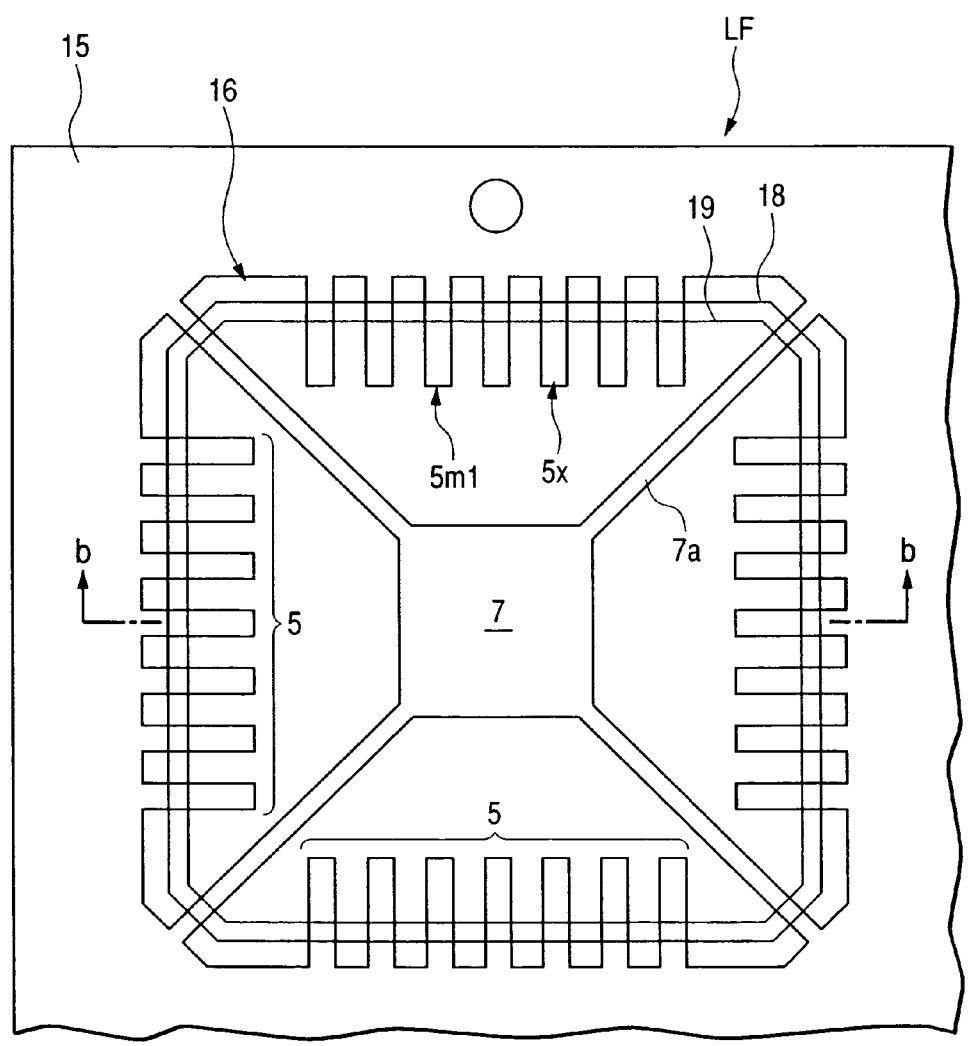
FIG. 9 is a partially enlarged, schematic plan view of FIG. 8.
Figure 10:
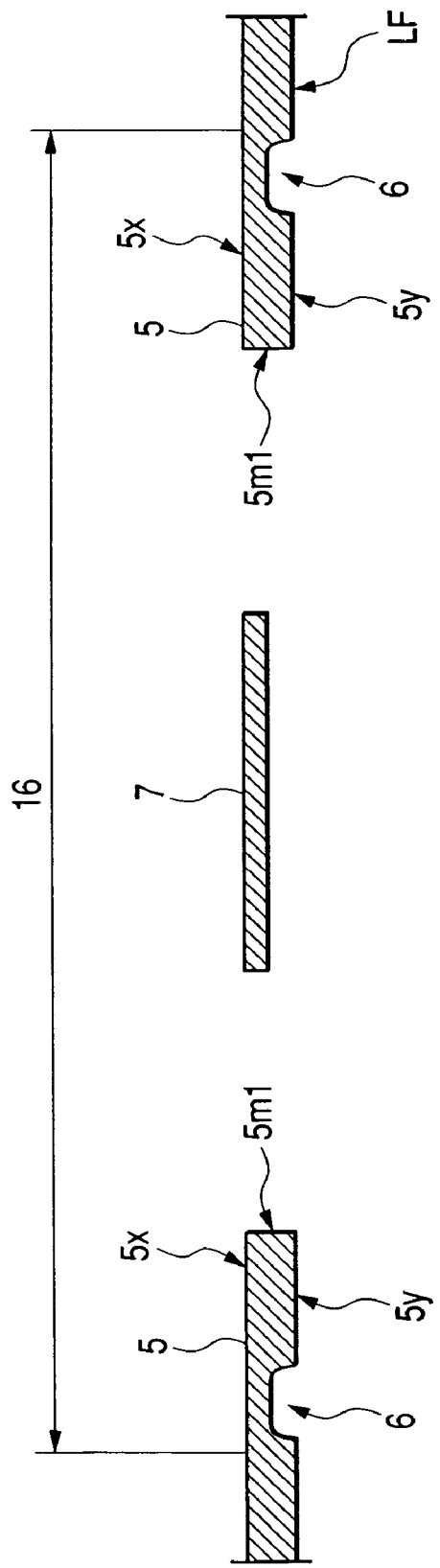
FIG. 10 is a schematic sectional view taken along line b-b in FIG. 9.
Figure 11:
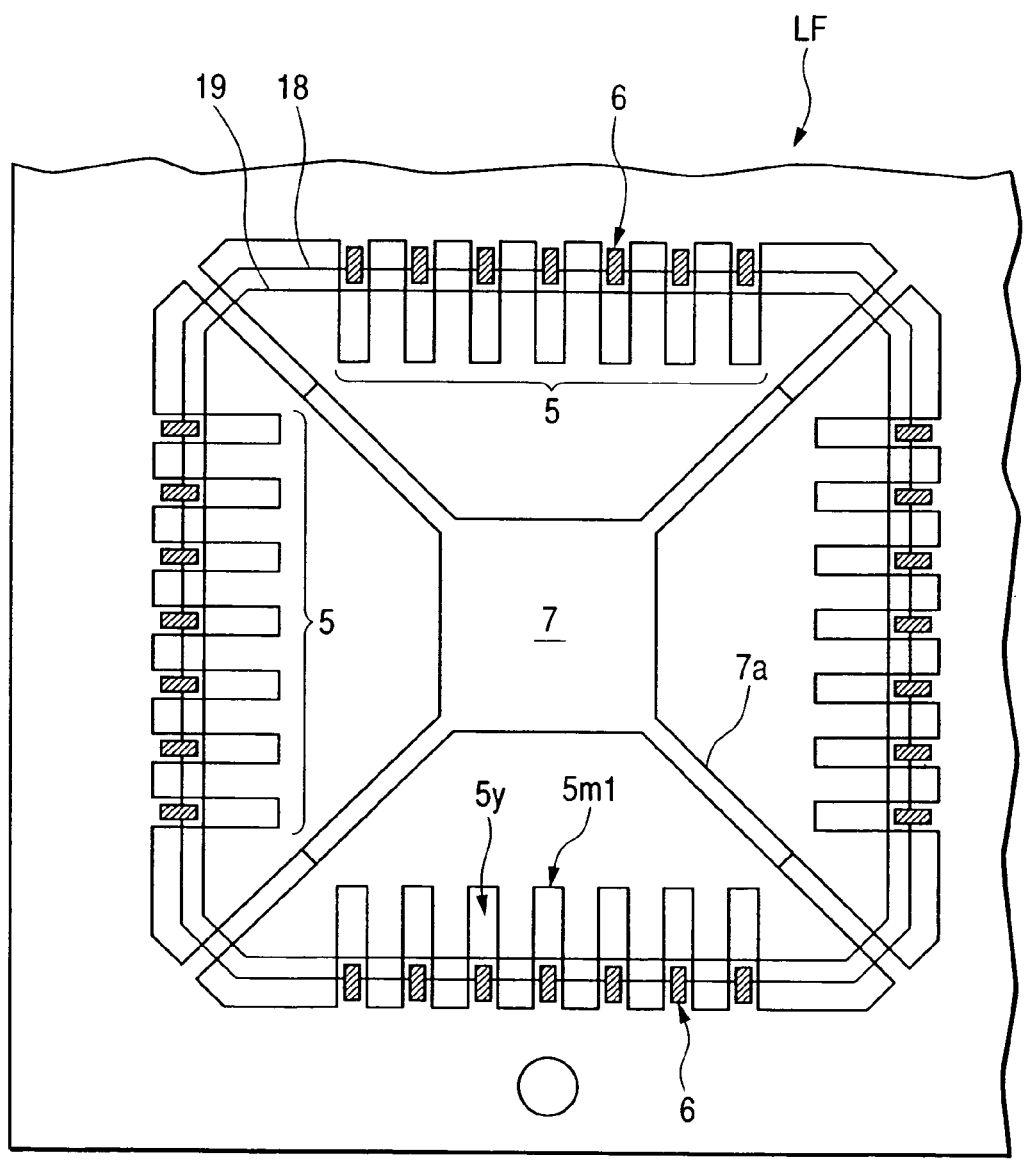
FIG. 11 is a schematic bottom view showing a back surface opposite to the side shown in FIG. 9.
Figure 15:
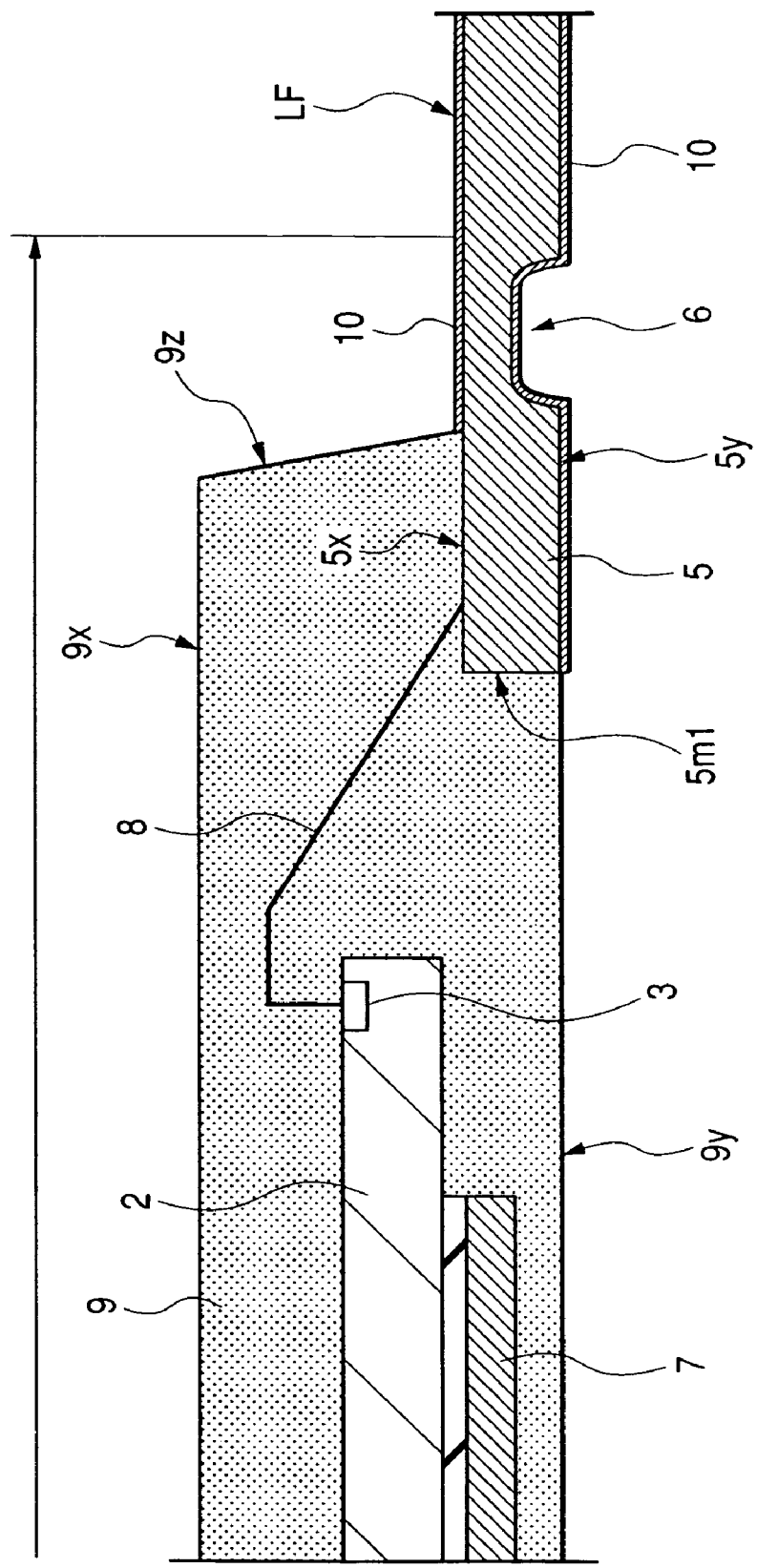
FIG. 15 is a schematic sectional view showing a plating step subsequent to FIG. 13 in the semiconductor device manufacturing process.
Figure 16:
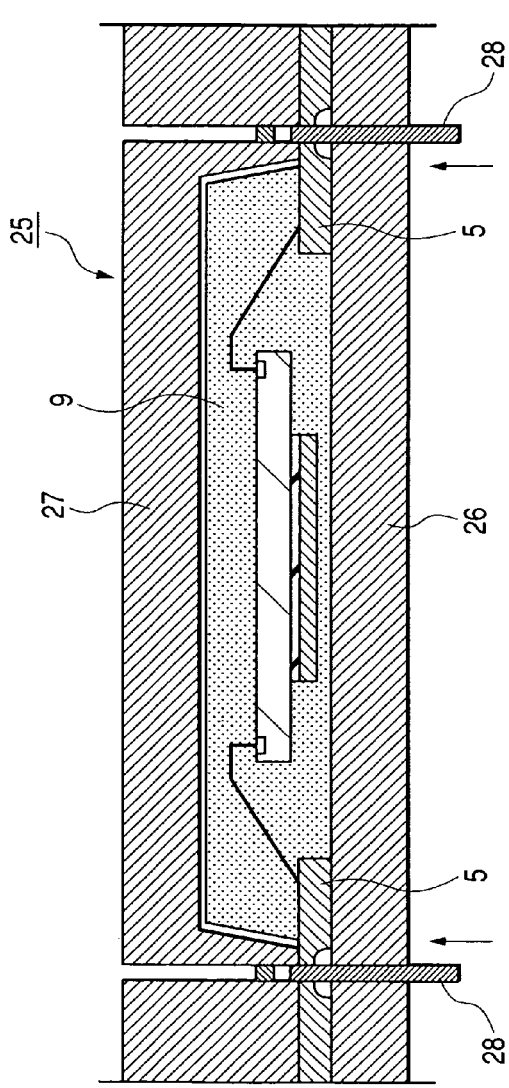
FIG. 16 is a schematic sectional view showing a cutting step subsequent to FIG. 15 in the semiconductor device manufacturing process.
Figure 17:
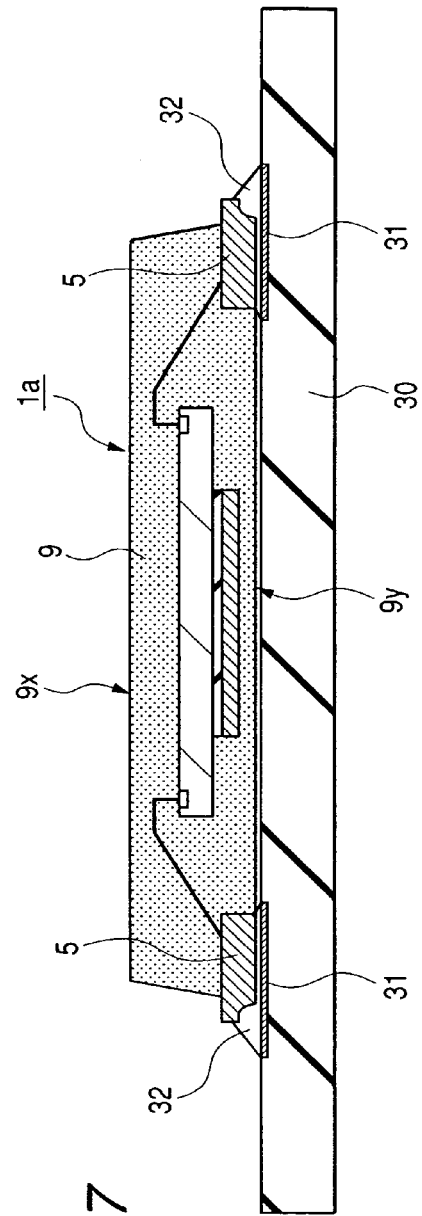
FIG. 17 is a schematic sectional view showing a packaged state of the semiconductor device of the first embodiment.
Figure 18:
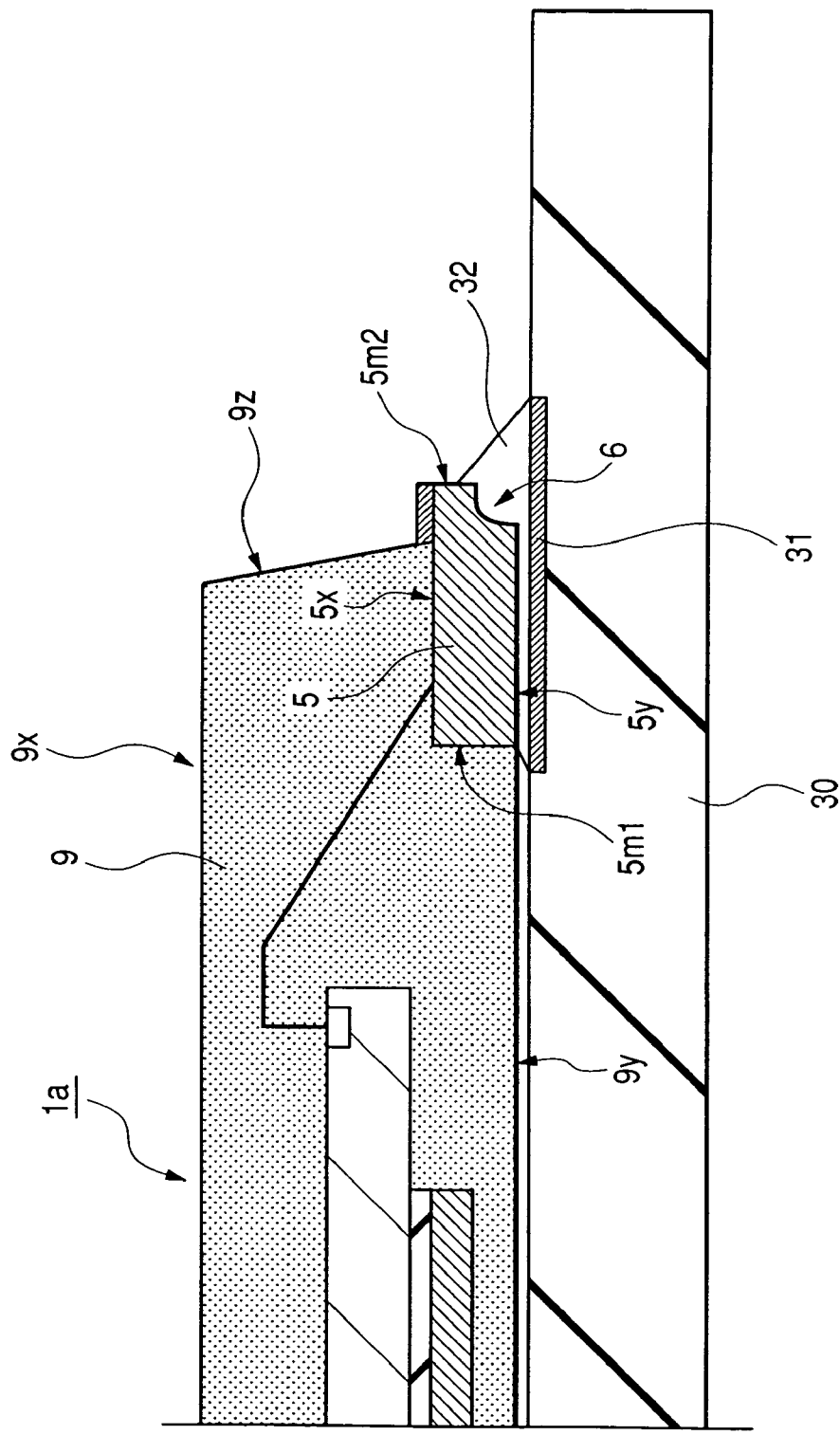
FIG. 18 is a partially enlarged, schematic sectional view of FIG. 17.

FIGS. 1 to 18 are related to a semiconductor device according to a first embodiment of the present invention, of which FIG. 1 is a schematic plan view (top view) showing an appearance structure of the semiconductor device, FIG. 2 is a schematic bottom view (underside view) thereof, FIG. 3 is a partially enlarged, schematic bottom view (underside view) of FIG. 2, FIGS. 4(a) and 4(b) show an internal structure of the semiconductor device, of which FIG. 4(a) is a schematic plan view with an upper portion of a resin sealing body removed and FIG. 4(b) is a schematic sectional view taken along line a-a in FIG. 4(a), FIG. 5 is a partially enlarged, schematic sectional view of FIG. 4(b), FIG. 6 is a schematic side view showing a part of the appearance structure of the semiconductor device, FIG. 7 is schematic perspective view showing a back surface of a lead in FIG. 5, FIG. 8 is a schematic plan view (top view) showing a part of a lead frame used in manufacturing the semiconductor device, FIG. 9 is a partially enlarged, schematic plan view of FIG. 8, FIG. 10 is a schematic sectional view taken along line b-b in FIG. 9, FIG. 11 is a schematic bottom view (underside view) showing a back surface opposite to the side shown in FIG. 9, FIGS. 12(a) and 12(b) show manufacturing steps for manufacturing the semiconductor device, of which FIG. 12(a) is a schematic sectional view showing a chip mounting step and FIG. 12(b) is a schematic sectional view showing a wire bonding step, FIGS. 13(a) and 13(b) show a resin sealing step subsequent to FIG. 12, of which FIG. 13(a) is a schematic sectional view showing a positioned state of the lead frame within a molding die and FIG. 13(b) is a schematic sectional view showing a resin-sealed state, FIG. 14 is partially enlarged, schematic sectional view of FIG. 13(a), FIG. 15 is a schematic sectional view showing a plating step subsequent to FIG. 13, FIG. 16 is a schematic sectional view showing a cutting step subsequent to FIG. 15, FIG. 17 is a schematic sectional view showing a packaged state of the semiconductor device, and FIG. 18 is a partially enlarged, schematic sectional view of FIG. 17.

To make the drawings easier to see, the illustration of a plating layer to be described later is omitted in some of the drawings.

As shown in FIGS. 4(a) and 4(b), the semiconductor device of this embodiment, indicated at 1a, is of a package structure having a semiconductor chip 2, plural leads 5, a chip support (die pad, tab) 7, four suspending leads 7a, plural bonding wires 8, and a resin sealing body 9. The semiconductor chip 2, plural leads 5, chip support 7, four suspending leads 7a and plural bonding wires 8 are sealed with the resin sealing body 9.

A planar shape of the semiconductor chip 2 intersecting its thickness direction is quadrangular, e.g., square in this embodiment. For example, the semiconductor chip 2 comprises a semiconductor substrate, plural transistor elements formed on a main surface of the semiconductor substrate, multiple wiring layers constituted by a stack of plural insulating layers and wiring layers on the main surface of the semiconductor substrate, and a surface protecting film (final protecting film) formed so as to cover the multiple wiring layers, although no limitation is made to this construction.

The semiconductor chip 2 has a main surface (circuit forming surface) 2x and a back surface 2y positioned on mutually opposite sides, with an integrated circuit being formed on the main surface 2x of the semiconductor chip 2. The integrated circuit is mainly composed of transistor elements formed on the main surface of the semiconductor substrate and wiring lines formed in the multiple wiring layers.

Plural bonding pads (electrodes) 3 are formed on the main surface 2x of the semiconductor chip 2. The plural bonding pads 3 are disposed along the sides of the semiconductor chip 2. The plural bonding pads 3 are formed in the top wiring layer out of the multiple wiring layers of the semiconductor chip 2 and are exposed through bonding apertures which are formed in the surface protecting film of the semiconductor chip 2 correspondingly to the bonding pads 3.

As shown in FIGS. 1 and 2, a planar shape of the resin sealing body 9 intersecting its thickness direction is quadrangular, e.g., square in this embodiment. The resin sealing body 9 has a main surface (upper surface) 9x and a back surface (lower surface, packaging surface) 9y which are positioned opposite to each other. A planar size (profile size) of the resin sealing body 9 is larger than that of the semiconductor chip 2.

For the purpose of reducing stress, the resin sealing body 9 is formed, for example, using a biphenyl-based thermosetting resin with a phenolic curing agent and silicone rubber and filler incorporated therein. A transfer molding method suitable for mass production is here adopted as a method for forming the resin sealing body 9. According to the transfer molding method, there is used a molding die provided with pots, runners, resin injecting gates and cavities, and a thermosetting resin is injected from the pots into the cavities through the runners and resin injecting gates to form resin sealing bodies.

In manufacturing a resin sealed type semiconductor device, there is adopted an individual type transfer molding method which uses a lead frame having plural product forming areas (device forming areas) and in which semiconductor chips mounted respectively in the product forming areas are sealed with resin individually for each of the product forming areas, or a block type transfer molding method in which semiconductor chips mounted in product forming areas are sealed with resin all together. For example, the individual type transfer molding method is adopted for manufacturing the semiconductor device 1a of this first embodiment.

As shown in FIGS. 4(a) and 4(b), the plural leads 5 are arranged along the four sides of the resin sealing body 9 and extend from side faces 9z of the resin sealing body 9 toward the semiconductor chip 2.

The plural bonding pads 3 of the semiconductor chip 2 are electrically connected to the plural leads 5 respectively. In this first embodiment, the electric connection between the bonding pads 3 of the semiconductor chip 2 and the leads 5 is performed through bonding wires 8. One ends of the bonding wires 8 are connected to the bonding pads 3 of the semiconductor chip 2, while opposite ends of the bonding wires opposite to the one ends are connected to the leads 5 at positions outside (around) the semiconductor chip 2. For example, gold (Au) wires are used as the bonding wires 8. A nail head bonding (ball bonding) method using a combination of thermocompression bonding and ultrasonic oscillation is used as an example of a method for connecting the wires 8.

As shown in FIGS. 4(a), 4(b) and FIG. 5, each of the plural leads 5 includes a first surface 5x positioned between the main surface 9x and the back surface (opposite to the main surface) 9y of the resin sealing body 9, a second surface 5y positioned on the side opposite to the first surface 5x and exposed from the back surface 9y of the resin sealing body 9 without being covered with the resin of the resin sealing body 9, a first end face 5m1 positioned on the semiconductor chip 2 side, a second end face 5m2 positioned on the side opposite to the first end face 5m1, and a recessed portion 6 which is depressed from the second surface 5y to the first surface 5x side.

In this first embodiment, the first surface 5x is used as a bonding surface to which the bonding wires 8 are connected. The first surface 5x extends inside and outside the resin sealing body 9 and projects from the side face 9z of the resin sealing body 9. The second surface 5y is used as a terminal portion for external connection. The second surface 5y is exposed from the back surface 9y of the resin sealing body 9 and is drawn out from the side face 9z of the resin sealing body 9. The first end face 5m1 is contiguous to the first and second surfaces 5x, 5y. The second end face 5m2 projects from the side face 9z of the resin sealing body 9 and is contiguous to the first and second surfaces 5x, 5y.

In this first embodiment, as shown in FIGS. 5 to 7, the recessed portion 6 terminates at the second end face 5m2 of the lead 5 and is exposed from the second end face 5m2. The recessed portion is spaced from both side faces (two side faces) of the lead 5 which side faces are positioned on mutually opposite sides in the width direction of the lead. The recessed portion 6 extends from the second end face 5m2 toward the first end face 5m1. Further, as shown in FIGS. 3 to 5, the recessed portion 6 is formed outside the side face of the resin sealing body 9. An inner wall surface of the recessed portion 6 is contiguous to the second surface 5y and the second end face 5m2.

The lead 5 having the recessed portion 6 can be formed by giving some consideration to the etching step at the time of forming a predetermined lead pattern in manufacturing a lead frame.

As shown in FIGS. 5 and 6, the surface of the lead 5 including the second surface 5y and the inner wall surface of the recessed portion 6 is covered with a plating layer 10 whose wettability for the solder material at the time of soldering the semiconductor device 1a to the wiring substrate is higher than that of the lead 5. The plating layer 10 is formed so as to cover the whole of the second surface 5y of the lead, the whole of the inner wall surface of the recessed portion 6 and the whole of an unsealed portion (the portion positioned outside the side face of the resin sealing body 9) of the first surface 5x of the lead 5.

As will be described later, the second end face 5m2 of the lead 5 is formed cutting off the lead 5 from the frame body of the lead frame in the cutting step included in the manufacturing process for the semiconductor device 1a. On the other hand, the plating layer 10 is formed in the plating step before the cutting step for the lead 5. Therefore, the second end face 5m2 of the lead 5 is basically not covered with the plating layer 10. In this first embodiment, however, in addition to the plating layer 10 which covers the second surface 5y of the lead 5, a plating layer 10 which covers the inner wall surface of the recessed portion 6 terminates at the second end face 5m2 and is exposed from the second end face.

Since the plating layer 10 is formed for the purpose of ensuring solder wettability at the time of soldering the semiconductor device 1a onto the wiring substrate, a suitable material of the plating layer is selected in accordance with the material of the solder material used in packaging. It is preferable that a material of the same composition as the solder material used in packaging be selected as the material of the plating layer 10. For example, in this first embodiment, to match a Pb-free solder having a composition of Sn (tin)—Bi (bismuth), which is used in packaging, there is used a plating layer of the same composition, i.e., Sn—Bi. This Sn—Bi plating layer can be formed easily for example by an electrolytic plating method which is suitable for mass production.

As shown in FIGS. 4(b) and 5, the chip support 7 is smaller than the profile size of the semiconductor chip 2 and the thickness thereof is smaller than the thickness between the first and second surfaces 5x, 5y of the lead 5. The chip support 7 has a main surface and a back surface positioned opposite to each other. The backs surface 2y of the semiconductor chip 2 is brought into contact with the main surface of the chip support 7 through an adhesive 4. The back surface of the chip support 7 is covered with the resin of the resin sealing body 9.

As shown in FIGS. 2 and 3, the four suspending leads 7a extend from the four corners of the resin sealing body 9 toward the chip support 7. Each suspending lead 7a comprises a first portion (the chip support 7 side) formed integrally with the chip support 7 and extending from the chip support 7 toward a corner of the resin sealing body 9 and a second portion (the corner side of the resin sealing body 9) formed integrally with the first portion and extend from the first portion toward the corner of the resin sealing body 9. The first portion is formed at substantially the same thickness as the chip support 7 and is positioned in the interior of the resin sealing body 9. The second portion is formed at substantially the same thickness as the portion between the first and second surfaces of the lead 5 and its surface positioned on the same side as the second surface 5y is exposed from the back surface 9y of the resin sealing body 9.

In the semiconductor device 1a of this first embodiment, a resin portion (projecting resin portion) 9a is formed integrally with the resin sealing body 9 and projects from each side face 9z of the resin sealing body at a position between adjacent leads 5. At the time of forming the resin sealing body 9 in accordance with the transfer molding method, resin flows from a cavity of a molding die into the space between adjacent leads at mating surfaces of the molding die, whereby the resin portion 9a is formed. The resin portion 9a may be allowed to remain as in this first embodiment, or as the case may be, it is removed in the manufacturing process.

Next, the lead frame used in manufacturing the semiconductor device 1a will be described below with reference to FIGS. 8 to 11.

As shown in FIG. 8, the lead frame, indicated at LF, has a multi-frame structure in which plural product forming areas (device forming areas) 16 partitioned by a frame body (support) 15 including an outer frame portion and an inner frame portion are arranged in a matrix shape. The plural leads 5, the chip support 7 and the four suspending leads 7a are arranged in each product forming area 16, as shown in FIGS. 9 to 11. The plural leads 5 are arranged dividedly into four lead groups. The leads 5 in each lead group are formed integrally with the frame body 15. The chip support 7 is formed integrally with the frame body 15 through the four suspending leads 7a.

Each of the plural leads 5 has the first surface 5x, the second surface 5y, the first end face 5m1 and the recessed portion 6. In FIGS. 9 to 11, the numeral 18 denotes a cutting line for cutting the leads 5 from the frame body 15. Numeral 19 denotes a molding line (sealing line) for resin sealing. The cutting line 18 is positioned between the frame body 15 and the molding line 19. In FIG. 11, the recessed portions 6 are hatched.

The recessed portions 6 are formed at positions exposed from cut surfaces of the leads 5 after cutting, i.e., the position of the cutting line 18. In this first embodiment, the recessed portions 6 are formed so as to straddle (cross) the cutting line 18. In the lead 5 shown in FIG. 5, the second end face 5m2 is a cut surface obtained by cutting the lead along the cutting line 8 shown in FIG. 5. Therefore, each lead 5 whose recessed portion 6 is exposed from the end face 5m2 can be formed either by forming the recessed portion 6 so as to straddle the cutting line 18 as in this first embodiment or by forming the recessed portion 6 so as to partially overlap the cutting line 18.

The chip support 7 and the first portion (not shown) of each suspending lead 7a are thinner than the thickness of the portion between the first surface 5x and the second surface 5y of each lead 5. The chip support 7, the first portions of the suspending leads 7a and the recessed portions 6 are formed giving some consideration to the etching step at the time of forming a predetermined lead pattern in fabricating the lead frame LF.

The lead frame LF thus constructed is fabricated by subjecting a metallic sheet formed of, for example, Cu (copper), Cu alloy, or Fi (iron)—Ni (nickel) alloy to etching or pressing or both etching and pressing to form a predetermined lead pattern.

Next, a description will be given below about manufacturing the semiconductor device 1a with reference to FIGS. 12 to 16.

First, not only the lead frame LF shown in FIGS. 8 to 11 is provided, but also the semiconductor chip 2 shown in FIG. 4 is provided.

Next, as shown in FIG. 12(a), the semiconductor chip 2 is mounted in each product forming area 16 of the lead frame LF. The mounting of the semiconductor chip 2 is performed by bonding and fixing the back surface 2y of the semiconductor chip 2 to the main surface of the chip support 7 through the adhesive 4.

Next, in each product forming area 16 of the lead frame LF, plural bonding pads 3 on the semiconductor chip 2 and plural leads 5 are electrically connected with each other through plural bonding wires 8, as shown in FIG. 12(b). The connection of the bonding wires 8 is performed by the nail head bonding method of the positive bonding type in which the bonding pads 3 on the semiconductor chip 2 are a primary connection side and the first surfaces 5x of the leads 5 are a secondary connection side.

Next, as shown in FIG. 13(a), the lead frame LF is positioned between an upper die 20a and a lower die 20b of a molding die 20. The positioning of the lead frame LF is performed in a state in which a sheet 22 is interposed between a back surface (the same side as the second surface 5y of each lead 5) and a mating surface of the lower die 20b. As the sheet 22 there is used, for example, a resin sheet able to withstand a molding heat temperature and capable of being crushed with a clamping force (pinching force) of the molding die.

The positioning of the lead frame LF is performed in a state in which the semiconductor chip 2, leads 5, chip support 7, suspending leads 7a and bonding wires 8 are positioned in the interior of each cavity 21 formed in each product forming area 16 of the lead frame LF.

The positioning of the lead frame LF is performed in a state in which the leads 5 are positioned while extending to both the cavity 21 and a mating surface of the upper die 20a and unsealed portions of the leads 5 are positioned between the mating surfaces of the upper and lower dies 20a, 20b.

The positioning of the lead frame LF is performed by clamping (pushing) the unsealed portions of the leads 5 and the portions of the sheet 22 corresponding to the lead unsealed portions with the mating surfaces of the upper and lower dies 20a, 20b.

The positioning of the lead frame LF is performed in a crushed state of the sheet 22 with the clamping force (pinching force) of both upper and lower dies 20a, 20b so that the leads 5 bite into the sheet 22.

Further, the positioning of the lead frame LF is performed in a state in which the recessed portions 6 of the leads 5 are positioned outside the cavity 21 (outside the molding line 19), i.e., between the mating surfaces of the upper and lower dies 20a, 20b.

Next, with the lead frame LF thus positioned, a molding resin, e.g., a thermosetting epoxy resin, is injected from the associated pot in the molding die 20 into the associated cavity 21 through the associated cull, runner and resin injecting gate to form the resin sealing body 9 as shown in FIG. 13(b). The semiconductor chip 2, leads 5, chip support 7, suspending leads 7a and bonding wires 8 are sealed with the resin sealing body 9 and the second surfaces 5y of the leads 5 are exposed from the back surface 9y of the resin sealing body 9.

In this step, the recessed portions 6 are each spaced from both side faces (two side faces) which are positioned opposite to each other in the width direction of the associated lead 5. Besides, since the second surface 5y of the lead 5 is pushed against the sheet 22, it is possible to prevent the inconvenience of resin getting into the recessed portion 6.

Next, the sheet 22 affixed to the back surface of the lead frame LF is peeled and the lead frame LF is taken out from the molding die 20, followed by a curing step for promoting the hardening of the resin sealing body 9. Then, as shown in FIG. 15, a plating layer 10 is formed on the surface of the lead frame LF including the second surface 5y of the leads 5 and the inner wall surfaces of the recessed portions 6. For example, the formation of the plating layer 10 is performed by an electrolytic plating method which is suitable for mass production.

Then, the lead frame LF is conveyed to a cutting device and the leads 5 are cut along the cutting line 18 (see FIG. 11) in the following manner. As shown in FIG. 16, unsealed portions (portions projecting from the side faces of the resin sealing body 9) of the leads and the frame body 15 are held vertically by both a punch guide 26 of a cutting die 25 and a receiving base 27, then a cutting punch 28 is raised from the punch guide 26 side toward the receiving base 27, and the leads 5 are cut by a shearing motion of both cutting punch 28 and receiving base 27.

In this cutting step, the recessed portions 6 are exposed from the cut surfaces (the second end faces 5$m$2) after cutting because they are formed in positions (cutting line 18) exposed from the cut surfaces of the leads 5. Moreover, since the inner wall surfaces of the recessed portions 6 are covered with the plating layer 10, the plating layer 10 formed on the inner wall surfaces of the recessed portions 6 are exposed from the cut surfaces (the second end faces 5$m$2), in addition to the plating layer 10 formed on the second surfaces 5$y$ of the leads 5. Now, the semiconductor device 1$a$ shown in FIGS. 1 to 6 is almost completed.

The method for cutting the leads 5 is not limited to the method in which the cutting punch 28 is raised from the punch guide 26 side toward the receiving base 27. There may be adopted a method in which the cutting punch 28 is lowered from the receiving base 27 side toward the punch guide 26. Further, there may be adopted a cutting method using a dicing blade.

The following description is now provided about packaging the semiconductor device 1$a$ with reference to FIGS. 17 and 18.

As shown in FIGS. 17 and 18, the semiconductor device 1$a$ is soldered to a wiring substrate 30. For example, the soldering is performed by a reflow soldering method. More specifically, first a paste-like solder 32 is fed for example by a screen printing method onto electrode pads (lands, foot print) 31 formed on a packaging surface of the wiring substrate 30. Then, the semiconductor device 1$a$ is positioned in such a manner that terminal portions for external connection (the second surfaces 5$y$ of the leads 5) of the semiconductor device are positioned on the electrode pads 31 of the wiring substrate 30. Thereafter, the semiconductor device 1$a$ is mounted onto the packaging surface of the wiring substrate 30, then the wiring substrate 30 is conveyed to for example an infrared reflow furnace, thereafter the solder is melted and then solidified. As a result, the leads 5 of the semiconductor device 1$a$ are fixed and connected electrically and mechanically to the electrode pads 31 of the wiring substrate 30 through the solder 32.

In the case of a conventional lead, a plating layer is not formed on the second end face (the end face projecting from a side face of the resin sealing body) of the lead, so that at the time of soldering the semiconductor device to the wiring substrate, the solder does not rise wet onto the second end face of the lead. On the other hand, as shown in FIG. 5, each lead 5 used in this first embodiment has the recessed portion 6 which is depressed from the second surface 5$y$ toward the first surface 5$x$ and contiguous to the second end face 5$m$2, and the plating layer 10 formed on the inner wall surface of the recessed portion 6 is exposed from the second end face 5$m$2. Consequently, as shown in FIGS. 17 and 18, the solder 32 rises wet onto the second end face 5$m$2 of the lead 5 and a solder fillet is formed on the second end face 5$m$2. Since the solder 32 thus rises wet onto the second end face 5$m$2 of the lead, the area of bonding between the lead 5 and the solder 32 increases with consequent increase in the strength of bonding between the electrode pads 31 of the wiring substrate 30 and the leads 5 of the semiconductor device 1$a$. As a result, it is possible to improve the packaging reliability of the semiconductor device 1$a$.

Besides, the area of bonding between each lead 5 and the solder 32 increases to a degree corresponding to the depth of the recessed portion 6 and the strength of bonding between the electrode pads 31 of the wiring substrate 30 and the leads 5 of the semiconductor device 1$a$ increases, so that the packaging reliability of the semiconductor device 1$a$ can be further improved.

The reduction in size (in planar size) of the QFN type semiconductor device can be attained by shortening the distance between each side face of the semiconductor chip and each side face 9$z$ of the resin sealing body 9. For shortening the distance, however, it is necessary to shorten each lead 5, resulting in that the length of the second surface (terminal portion for external connection) 5$y$ of the lead 5 becomes shorter. As a result of the length of the second surface 5$y$ of the lead 5 becoming shorter, the area of bonding between the electrode pads 31 of the wiring substrate 30 and the leads 5 at the time of soldering the semiconductor device becomes smaller, so that a packaging defect such as peeling of the semiconductor device 1$a$ from the wiring substrate 30 becomes more likely to occur.

In this first embodiment, as described earlier, since the solder 32 rises wet onto the second end face 5$m$2 of each lead 5, the area of bonding between the lead 5 and the solder 32 increases. Besides, the area of bonding between each lead 5 and the solder 32 increases to a degree corresponding to the depth of the recessed portion 6 of the lead. Therefore, even if the length of the second surface 5$y$ of the lead 5 becomes shorter as a result of reduction in size of the semiconductor device 1$a$, it is possible to suppress the occurrence of a packaging defect such as peeling of the semiconductor device 1$a$ from the wiring substrate 30. That is, the reduction in size of the semiconductor device 1$a$ can be attained while ensuring the packaging reliability.

According to studies made by the present inventors, even if a recessed portion depressed from the second surface 5$y$ of each lead 5 toward the first surface 5$x$ and contiguous to both side faces of the lead positioned opposite to each other in the width direction of the lead is formed in the cut portion (cutting line 18) of the lead, it is possible to increase the area of bonding between the leads 5 and the solder 32. In the case of such a recessed portion, however, the resin which has entered between adjacent leads in the molding step gets into the recessed portion and the recessed portion is covered with the resin, so it is necessary to remove the resin before formation of the plating layer 10. This results in an increase of the manufacturing cost. On the other hand, since the recessed portion 6 used in this first embodiment is spaced away from both side faces of each lead 5, the resin which has entered between adjacent leads does not get into the recessed portion 6.

Further, even if a through hole extending through both the first and second surfaces 5$x$, 5$y$ of each lead 5 is formed in the cut portion of the lead 5, the area of bonding between the lead 5 and the solder 32 can be increased. In the case of such a through hole, the resin which has entered between adjacent leads does not get into the through hole, but since the mating surface of the upper die 20$a$ in the molding die 20 and the first surface 5$x$ of each lead is low in adhesion, a very small amount of resin enters between the two and then gets into the through hole. This is not limited to the formation of such a through hole, but is also true of the case where a recessed portion is formed in the first surface 5$x$ of each lead 5. If resin enters from the first surface 5$x$ side of the lead 5, the recessed portion is covered with the resin, so it is necessary to remove the resin before forming the plating layer 10, thus resulting in an increase of the manufacturing cost. If the clamping force of the molding die 20 increases to such an extent as induces a plastic deformation of each lead 5, it is possible to suppress the entry of resin to between the mating surface of the upper die 20a and the first surface 5x of the lead 5, but a lowering of the manufacturing yield results. With the through hole, moreover, the volume of the lead 5 decreases with consequent decrease in strength of the lead, so that a packaging defect is likely to occur. On the other hand, the recessed portion used in this first embodiment is not contiguous to the first surface 5x of the lead 5 and therefore it is not necessary to increase the clamping force of the molding die 20 to such an extent as induces a plastic deformation of each lead 5. Further, the sheet 22 is provided between the second surface 5y of each lead 5 and the mating surface of the lower die 20b and the adhesion between the second surface 5y of the lead 5 and the sheet 22 is higher than the adhesion between the mating surface of the lower die 20b and the second surface 5y of the lead 5, so that the resin does not enter between the sheet 22 and the second surface 5y of the lead 5.

Thus, according to this first embodiment, it is possible to improve the packaging reliability of the semiconductor device 1a. Besides, it is possible to reduce the size of the semiconductor device 1a while ensuring the packaging reliability. Moreover, the semiconductor device 1a high in packaging reliability can be manufactured in high yield. Further, the semiconductor device 1a high in packaging reliability can be manufactured at low cost.

Second Embodiment

In this second embodiment, a description will be given of an example in which the present invention is applied to a semiconductor device including leads provided with anti-dislodgment means.

Figure 19:
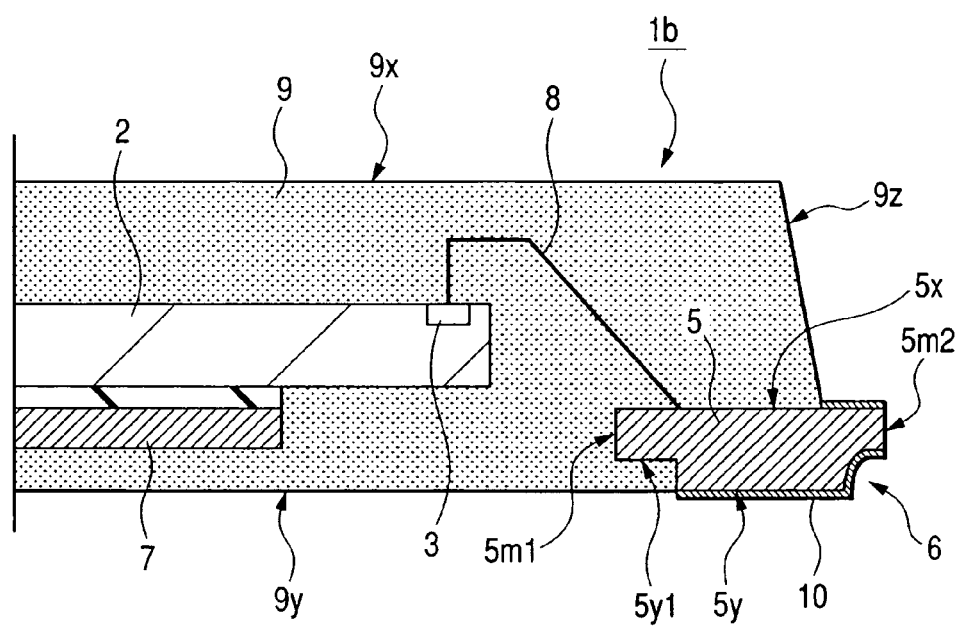
FIG. 19 is a schematic sectional view showing a part of an internal structure of a semiconductor device according to a second embodiment of the present invention.
Figure 20:
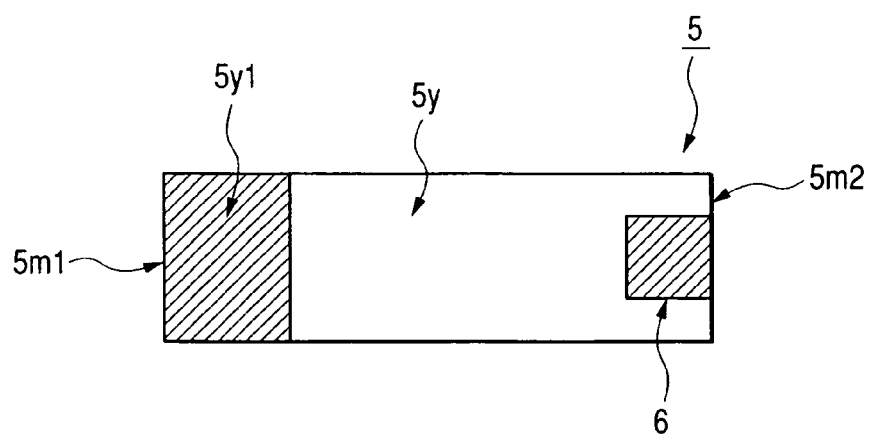
FIG. 20 is a schematic bottom view (underside view) of a lead shown in FIG. 19.

FIG. 19 is a schematic sectional view showing a part of an internal structure of the semiconductor device according to this second embodiment of the present invention, and FIG. 20 is a schematic bottom view (underside view) of a lead shown in FIG. 19.

As shown in FIG. 19, the semiconductor device of this second embodiment, indicated at 1b, is basically of the same construction as the previous first embodiment, with a difference lying in the construction of each lead 5.

As shown in FIGS. 19 and 20, each lead 5 has, in addition to the above construction, a third surface 5y1 positioned on the side opposite to the first surface 5x and closer to the first surface 5x than the second surface 5y. The third surface 5y1 is contiguous to the first end face 5m1, is positioned within the resin sealing body 9 and is covered with the resin of the resin sealing body 9. The third surface 5y1 is provided for the purpose of suppressing the peeling of the lead 5 from the resin sealing body 9.

When the third surface 5y1 is provided in each lead 5 to prevent dislodgment of the lead, the length of the second surface of the lead 5 becomes shorter, and at the time of soldering the semiconductor device 1b to the wiring substrate 30, the area of bonding between the lead 5 and the solder 32 becomes smaller, with consequent lowering in the strength of bonding between the electrode pads 31 of the wiring substrate 30 and the leads 5 of the semiconductor device 1. However, since each lead 5 is provided with the recessed portion 6, the reduction in the area of bonding caused by the provision of the third surface 5y1 can be suppressed. Thus, the present invention is effectively applicable to a semiconductor device including leads 5 provided with anti-dislodgment means.

The third surface 5y1 can be formed easily by giving some consideration to the etching step in manufacturing the lead frame. It can also be formed easily by bending leads after formation of the leads. In this case, the first surface 5x includes portions of different heights, more particularly, a first portion to which wires are connected and a second portion lower than the first portion.

Third Embodiment

In this third embodiment, a description will be given of a first modification in which the shape of a recessed portion formed in each lead is changed.

Figure 21:
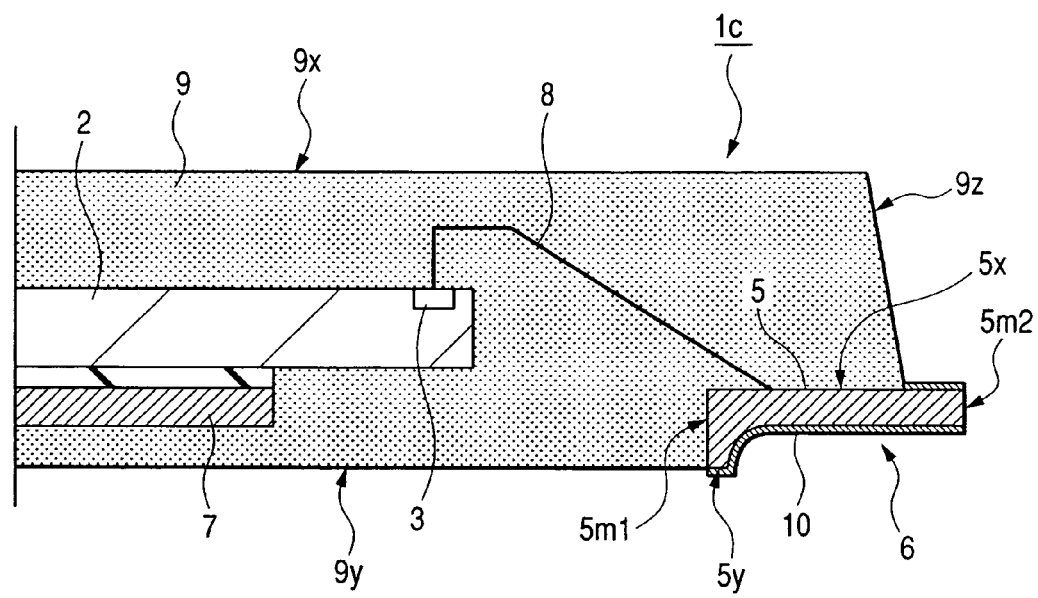
FIG. 21 is a schematic sectional view showing a part of an internal structure of a semiconductor device according to a third embodiment of the present invention.
Figure 22:
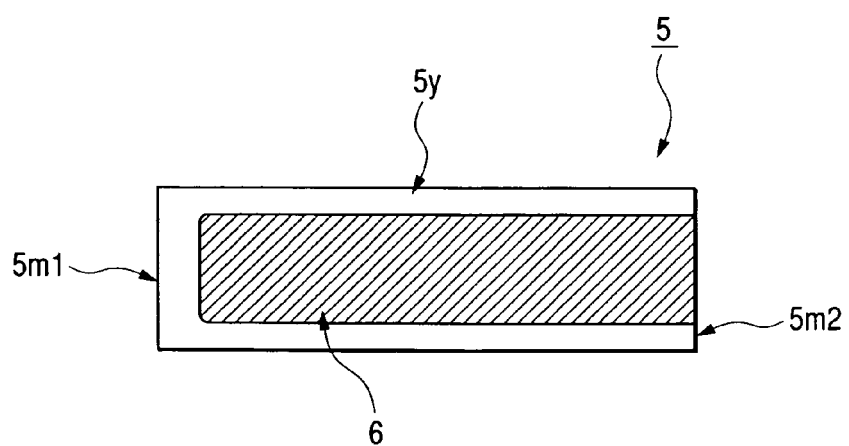
FIG. 22 is a schematic bottom view (underside view) of a lead shown in FIG. 21.

FIG. 21 is a schematic sectional view showing a part of an internal structure of a semiconductor device according to a third embodiment of the present invention and FIG. 22 is a schematic bottom view (underside view) of a lead shown in FIG. 21.

The recessed portion 6 in the first embodiment is formed outside a side face 9z of the resin sealing body 9. As shown in FIG. 21, a recessed portion 6 used in this third embodiment is formed both outside and inside a side face 9z of the resin sealing body 9. As shown in FIG. 22, the recessed portion 6 is exposed from the second end face 5m2 of each lead 5 and is spaced away from both side faces opposed to each other in the width direction of the lead 5 and also from the first end face 5m1. According to such a construction, in comparison with the first embodiment, when the semiconductor of this embodiment, indicated at 1c, is mounted by soldering, the area of bonding between each lead 5 and the solder 32 increases and so does the strength of bonding between the electrode pads 31 of the wiring substrate 30 and the leads 5 of the semiconductor device 1c, whereby the packaging reliability of the semiconductor device 1c can be improved.

Fourth Embodiment

In this fourth embodiment, a description will be given of a modification in which the shape of a recessed portion formed in each lead is changed.

Figure 23:
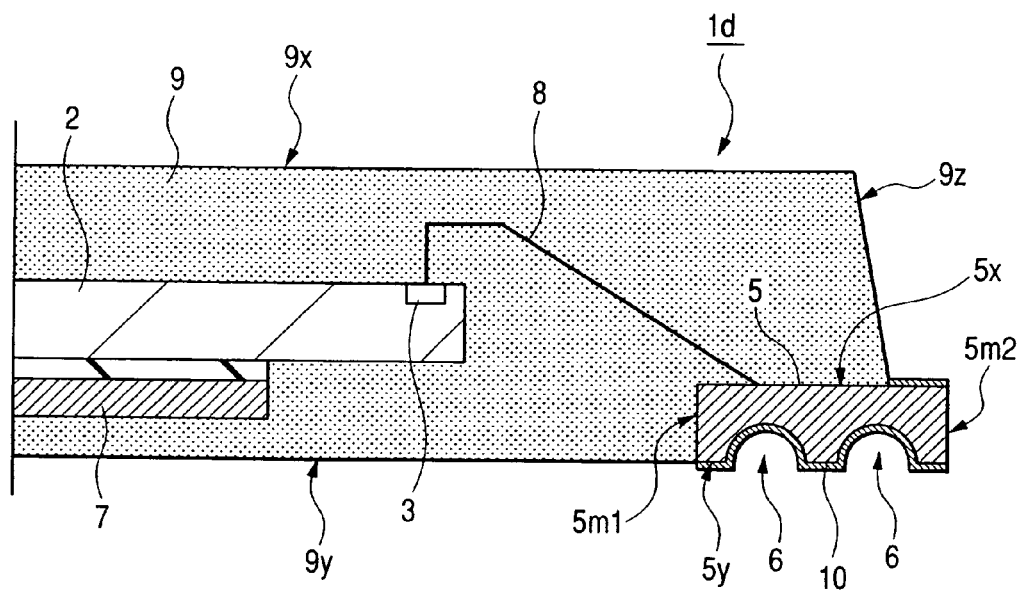
FIG. 23 is a schematic sectional view showing a part of an internal structure of a semiconductor device according to a fourth embodiment of the present invention.
Figure 24:
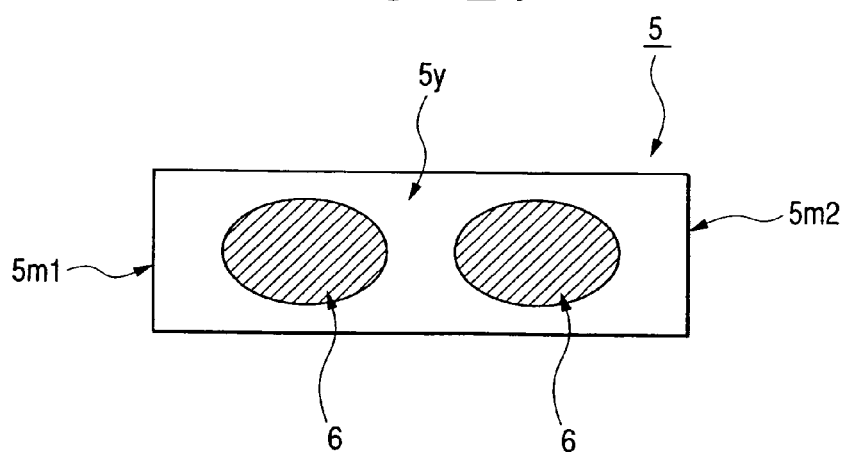
FIG. 24 is a schematic bottom view (underside view) of a lead shown in FIG. 23.

FIG. 23 is a schematic sectional view showing a part of an internal structure of a semiconductor device according to a fourth embodiment of the present invention and FIG. 24 is a schematic bottom view (underside view) of a lead shown in FIG. 23.

Although the recessed portion 6 described in the first and second embodiments is contiguous to the second end face 5m2 of each lead 5, a recessed portion 6 used in this fourth embodiment is spaced apart from both side faces opposed to each other in the width direction of the lead and also from the first and second end faces 5m1, 5m2. The recessed portion 6 used in this fourth embodiment is provided in a plural number so as to be dotted both outside and inside a side face 9z of the resin sealing body 9. According to this construction, when the semiconductor device, indicated at 1d, of this embodiment is soldered to the wiring substrate 30, the area of bonding between each lead 5 and the solder 32 increases with consequent increase in the strength of bonding between the electrode pads 31 of the wiring substrate 30 and the leads 5 of the semiconductor device 1d, so that the packaging reliability of the semiconductor device 1d can be improved also in this fourth embodiment. Moreover, the reduction in size of the semiconductor device 1d can be attained while ensuring the packaging reliability.

Fifth Embodiment

In this fifth embodiment, a description will be given of a modification in which the shape of a recessed portion formed in each lead is changed.

Figure 25:
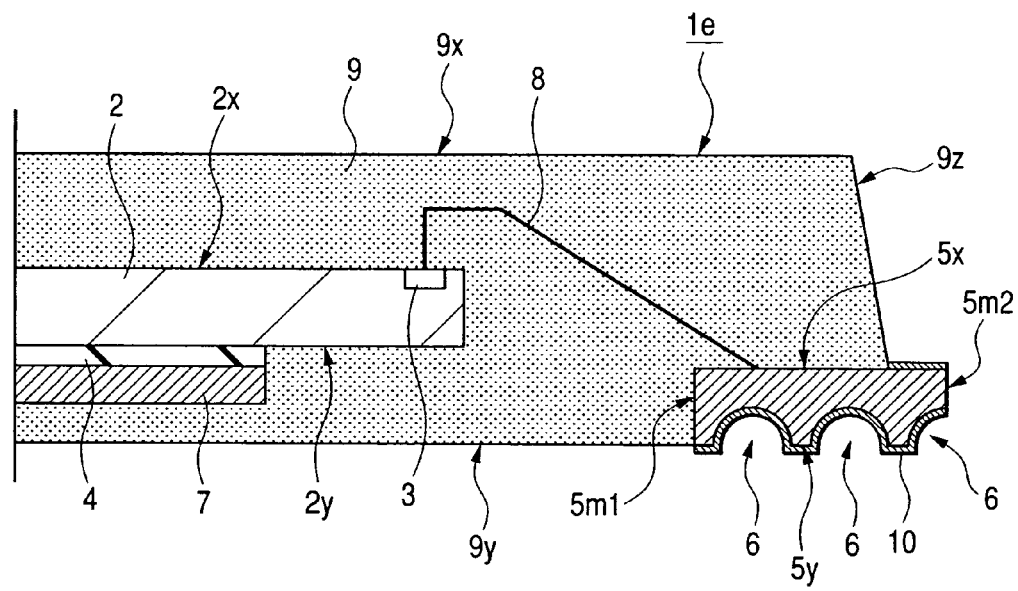
FIG. 25 is a schematic sectional view showing a part of an internal structure of a semiconductor device according to a fifth embodiment of the present invention.
Figure 26:
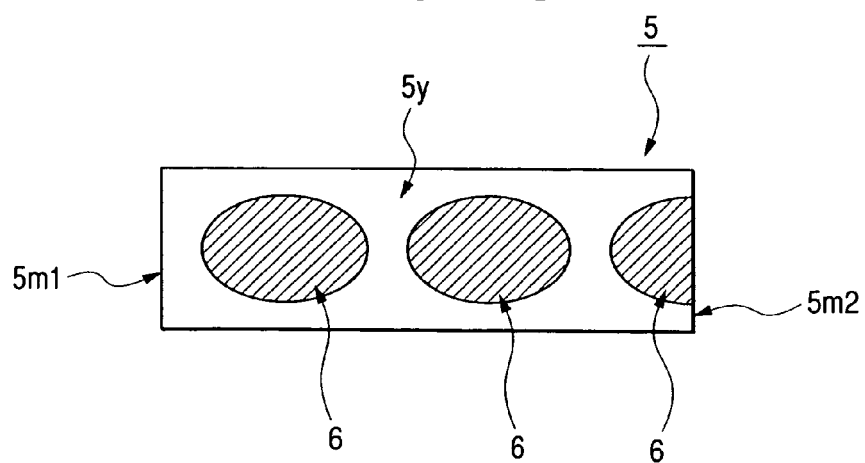
FIG. 26 is a schematic bottom view (underside view) of a lead shown in FIG. 25.

FIG. 25 is a schematic sectional view of a principal portion, showing an internal structure of a semiconductor device according to a fifth embodiment of the present invention and FIG. 26 is a schematic bottom view (underside view) of a lead shown in FIG. 25.

Leads 5 used in this fifth embodiment each include a first surface 5x positioned between the main surface 9x and the back surface 9y of the resin sealing body 9, a second surface 5y positioned on the side opposite to the first surface 5x and exposed from the back surface 9y of the resin sealing body 9, a first end face 5m1 positioned on the semiconductor chip 2 side, a second end face 5m2 positioned on the side opposite to the first end face 5m1 and exposed from a side face 9z of the resin sealing body 9, and plural recessed portions 6 which are depressed from the second surface 5y toward the first surface 5x. At least one of the plural recessed portions 6 is contiguous to the second end face 5m2 of the lead 5, and inner wall surfaces of the second surface 5y and of the plural recessed portions 6 are covered with a plating layer 10 which is higher in solder wettability than the second end face 5m2 of the lead 5. The plural recessed portions 6 are dotted both outside and inside a side face 9z of the resin sealing body 9.

Also according to the semiconductor device, indicated at 1e, of this fifth embodiment having the thus-constructed leads 5, there are obtained the same effects as in the first embodiment.

Sixth Embodiment

In this sixth embodiment, a description will be given of an example in which the present invention is applied to a semiconductor device with a chip support exposed from the back surface of the resin sealing body.

Figure 27:
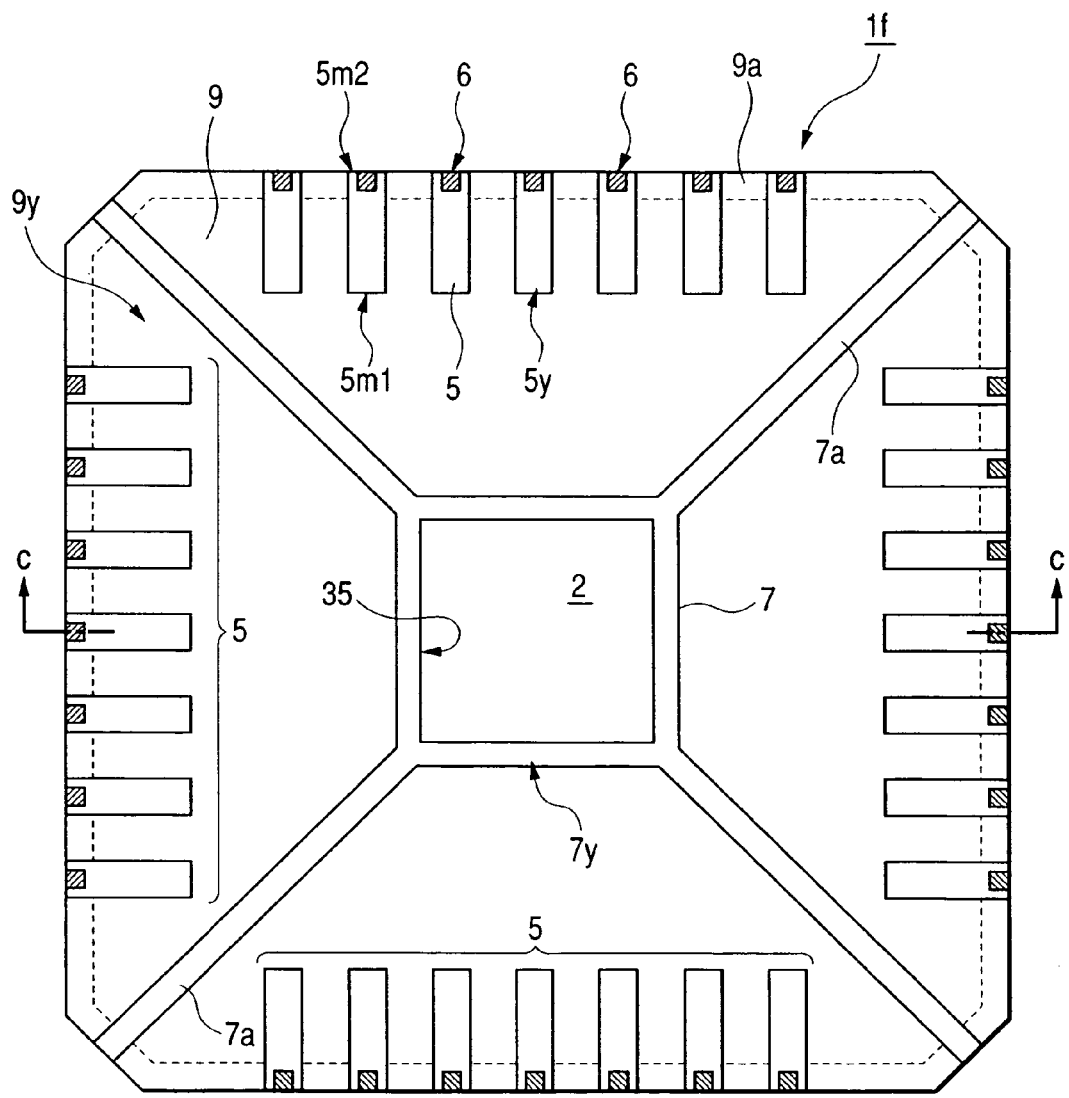
FIG. 27 is a schematic bottom view (underside view) showing an appearance structure of a semiconductor device according to a sixth embodiment of the present invention.

FIG. 27 is a schematic bottom view (underside view) showing an appearance structure of a semiconductor device according to a sixth embodiment of the present invention and FIG. 28 is a schematic sectional view of a principal portion taken along line c-c in FIG. 27.

The semiconductor device of this sixth embodiment, indicated at 1f, has such a package structure as shown in FIGS. 27 and 28 in which a back surface 2y of a semiconductor chip 2 is bonded to a main surface (chip mounting surface) 7x of a chip support 7 through an adhesive 4 and a back surface 7y opposite to the main surface 7x of the chip support 7 is exposed from a back surface 9y of a resin sealing body 9. The chip support 7 has a recessed portion 35 which is depressed from the back surface 7y toward the main surface 7x. The recessed portion 35 is spaced away from a peripheral edge of the chip support 7 and is not contiguous to a side face of the chip support 7. Though not shown, an inner wall surface of the recessed portion 35 is covered with a plating layer 10 like the recessed portion 6 described previously.

The semiconductor chip 2 generates heat during operation of an integrated circuit. In the case where the amount of the heat generated is large, there is adopted such a construction as this sixth embodiment in which the chip support 7 is exposed from the back surface 9y of the resin sealing body 9 and is soldered to connecting pads formed on a wiring substrate to improve the heat dissipating performance. In case of mounting a high frequency circuit as the integrated circuit on the semiconductor chip, the potential of the chip support 7 is fixed in order to stabilize the circuit operation. The fixing of potential of the chip support 7 is effected by exposing the chip support 7 from the back surface 9y of the resin sealing body 9 and soldering the chip support 7 to an electrode pad for power supply. That is, the exposure of the chip support 7 is performed for the purpose of improving the heat dissipating performance and stabilizing the circuit operation.

By thus forming the recessed portion 35 in the chip support 7, the area of bonding between the chip support and a solder material increases at the time of soldering the semiconductor device if to the wiring substrate, so that the packaging reliability of the semiconductor device 1f to which the chip support 7 is soldered can also be improved.

Seventh Embodiment

In this seventh embodiment, a description will be given of an example in which the present invention is applied to a QFN semiconductor device of a face-down structure.

FIG. 29 is a schematic sectional view of a principal portion, showing an internal structure of a semiconductor device according to a seventh embodiment of the present invention.

As shown in FIG. 29, the semiconductor device of this seventh embodiment, indicated at 1g, uses salient electrodes 36 as means for electrically connecting bonding pads 3 of a semiconductor chip 2 and leads 5 with each other. Each of the salient electrodes 36 is positioned between the bonding pad 3 of the semiconductor chip 2 and the first surface 5x of the lead 5 to connect them electrically and mechanically. Also in the semiconductor device 1g of such a face-down structure there are obtained the same effects as in the first embodiment.

Eighth Embodiment

In the first embodiment reference has been made to an example of manufacturing a semiconductor device in accordance with an individual type transfer molding method, while in this eighth embodiment reference will be made to an example of manufacturing a semiconductor device in accordance with a block type transfer molding method.

Figure 30A:
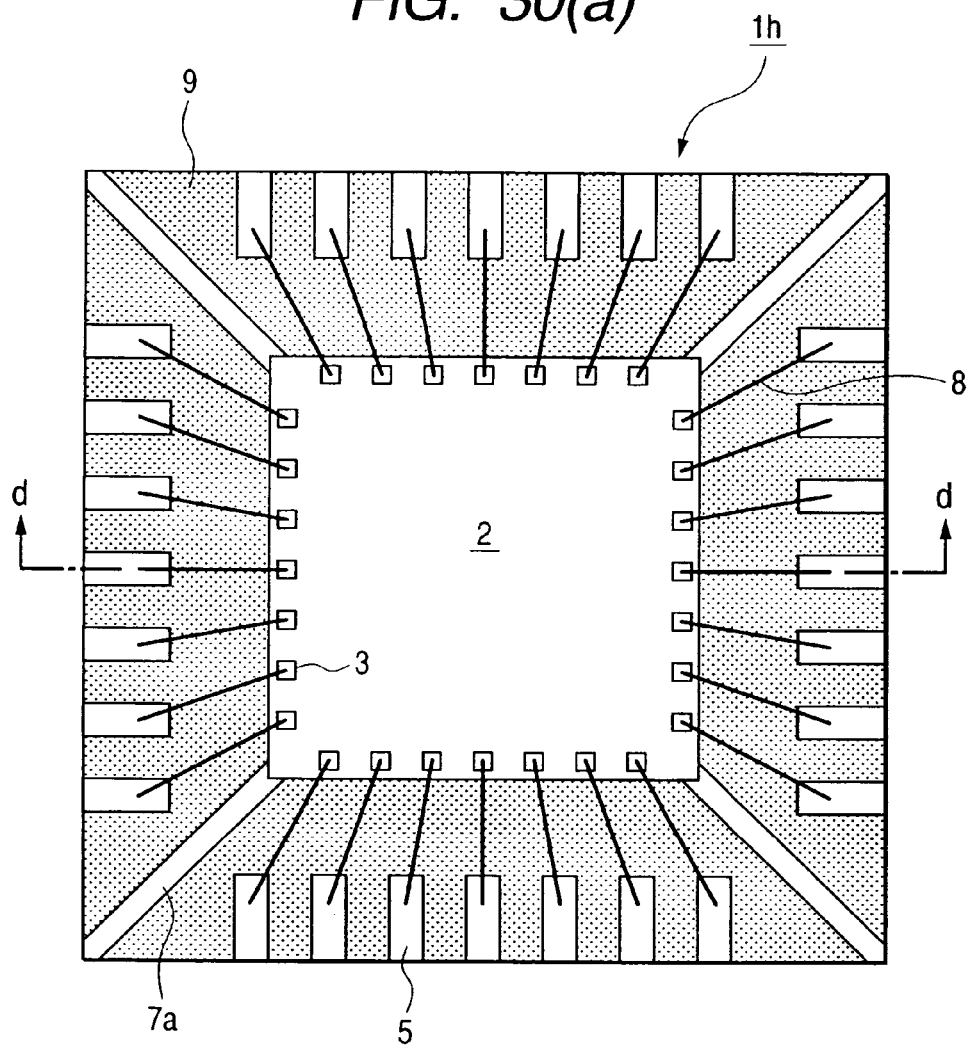
Figure 30B:
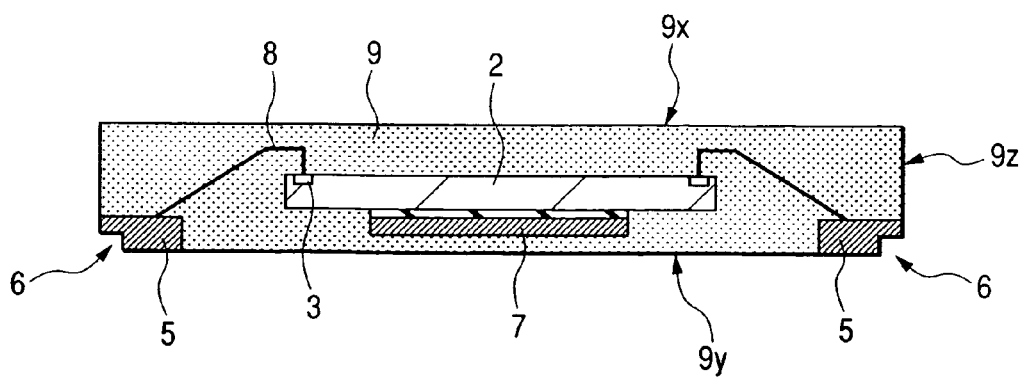
Figure 31:
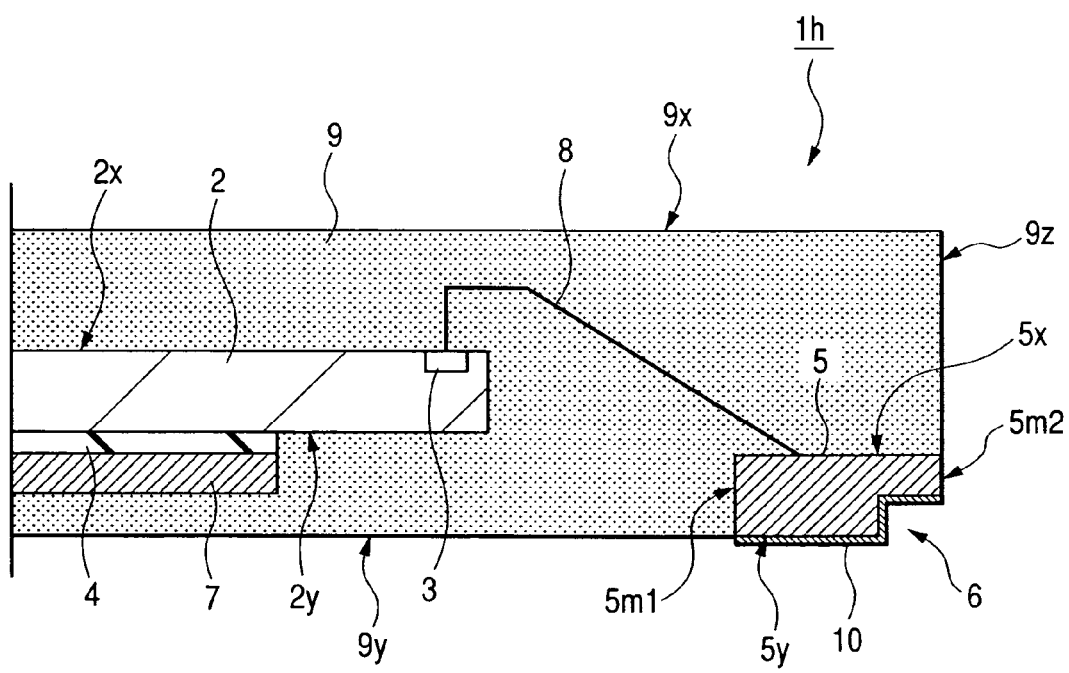
FIG. 31 is a partially enlarged, schematic sectional view of FIG. 30(b)
Figure 32:
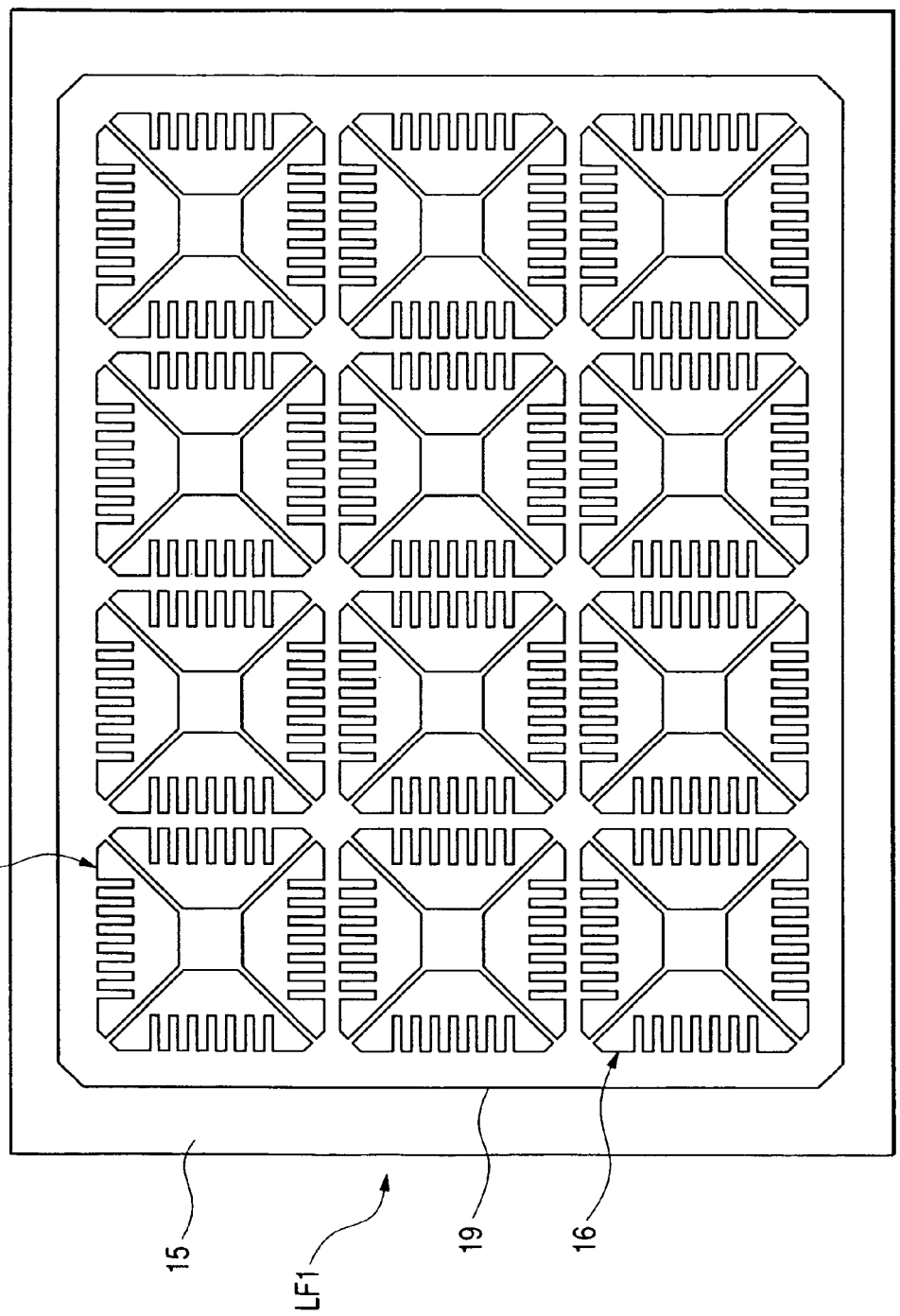
FIG. 32 is a schematic plan view of a lead frame used in manufacturing the semiconductor device of the eighth embodiment.
Figure 33:
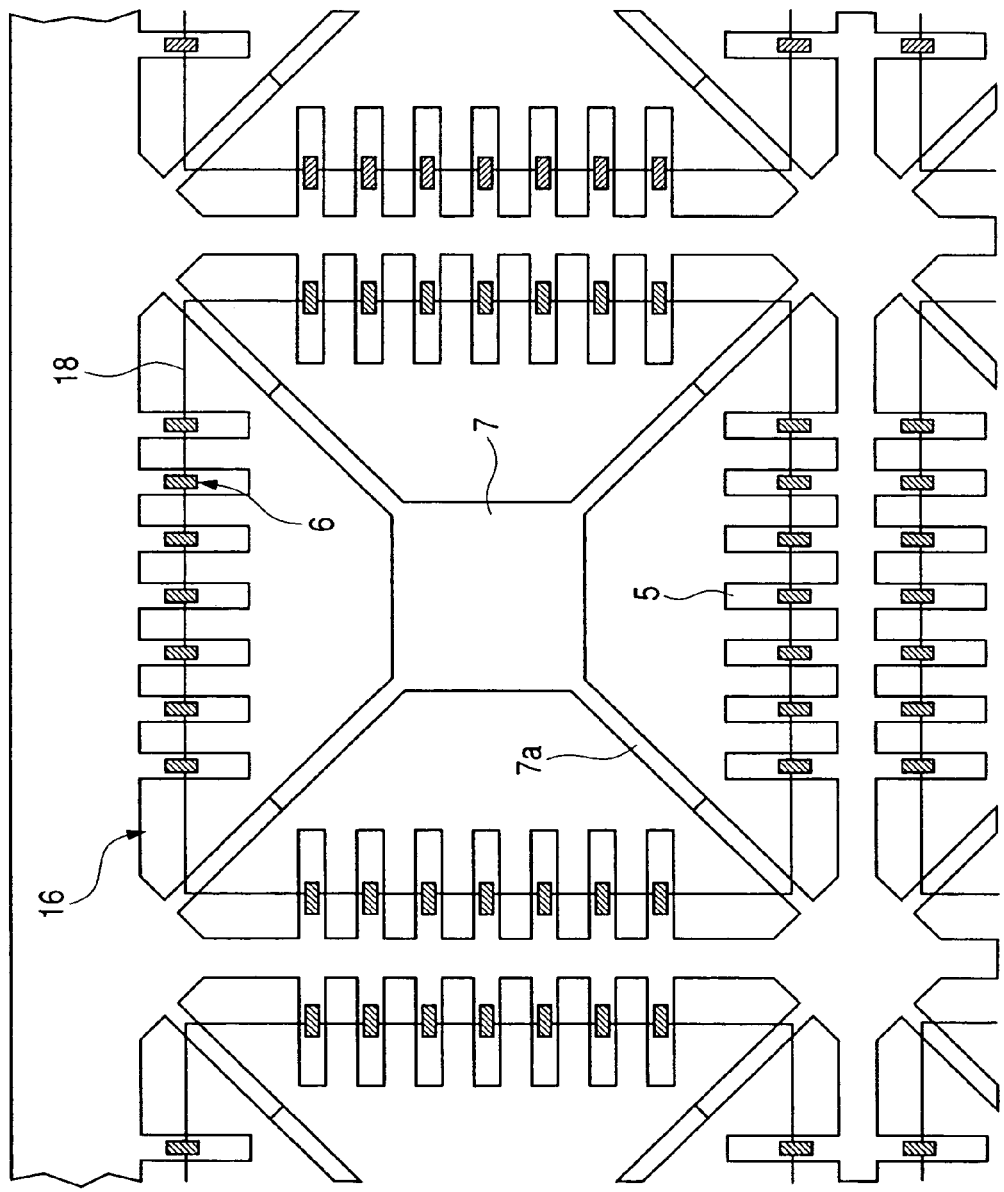
FIG. 33 is a partially enlarged, schematic bottom view of FIG. 32, showing a back surface as an opposite surface.
Figure 36:
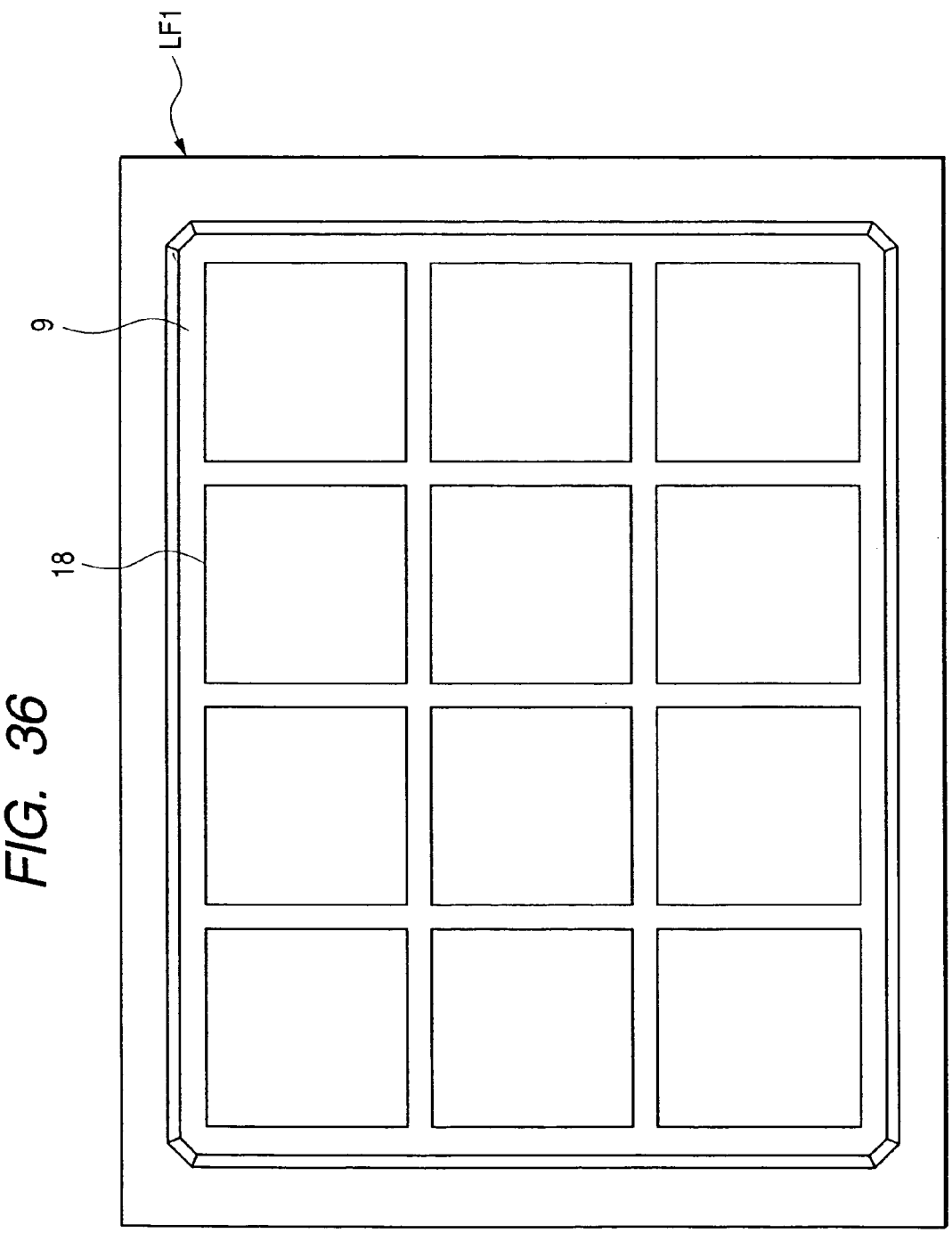
FIG. 36 is a schematic plan view showing a resin sealing body formed in a resin sealing step shown in FIG. 35(b)

FIGS. 30(a) and 30(b) show an internal structure of a semiconductor device according to an eighth embodiment of the present invention, of which FIG. 30(a) is a schematic plan view with an upper portion of a resin sealing body removed and FIG. 30(b) is a schematic sectional view taken along line d-d in FIG. 30(a), FIG. 31 is a partially enlarged, schematic sectional view of FIG. 30(b), FIG. 32 is a schematic plan view of a lead frame used in manufacturing the semiconductor device in the eighth embodiment, FIG. 33 is a partially enlarged, schematic bottom view of FIG. 32, showing a back surface as an opposite surface, FIGS. 34(a) and 34(b) show manufacturing steps for the semiconductor device of the eighth embodiment, of which FIG. 34(a) is a schematic sectional view showing a wire bonding step and FIG. 34(b) is a schematic sectional view showing a resin sealing step, FIGS. 35(a) and 35(b) show semiconductor device manufacturing steps subsequent to FIG. 34, of which FIG. 35(a) is a schematic sectional view showing a plating step and FIG. 35(b) is a schematic sectional view showing a cutting step, and FIG. 36 is a schematic plan view showing a resin sealing body formed in a resin sealing step shown in FIG. 35(b).

As shown in FIGS. 30 and 31, a semiconductor device 1h of this eighth embodiment is basically of the same construction as the first embodiment and is different in the following construction.

In a resin sealing body 9 used in this eighth embodiment, its main surface 9x and back surface 9y are almost equal in profile size and its side faces 9z are substantially perpendicular to the main surface 9x and back surface 9y. Further, second end faces 5m2 of leads 5 are substantially flush with the side faces 9z of the resin sealing body 9.

For manufacturing the semiconductor device 1h of this eighth embodiment there is adopted a block type transfer molding method which uses a lead frame LF1 (see FIGS. 32 and 33) having plural product forming areas and in which semiconductor chips mounted respectively in the product forming areas 16 are sealed with resin all together. According to the block type transfer molding method, after the resin sealing body is formed, the lead frame and the resin sealing body are divided into individual product forming areas (division into individual pieces). A description will be given below about manufacturing the semiconductor device 1h with reference to FIGS. 33 to 35.

First, the lead frame LF1 shown in FIGS. 32 and 33 is provided, then in each product forming area 16 of the lead frame LF1, a semiconductor chip 2 is bonded and fixed to a chip support 7, as shown in FIG. 34(a). Thereafter, in each product forming area 16, plural bonding pads 3 of the semiconductor chip 2 and plural leads 5 are electrically connected with each other through plural bonding wires 8, a shown in FIG. 34(a).

Next, the semiconductor chips 2 disposed respectively in the product forming areas 16 of the lead frame LF are sealed with resin all together, and as shown in FIGS. 34(b) and 35, the plural product forming areas 16 are sealed with a single resin sealing body 9. In each product forming area 16, second surfaces 5y of the leads 5 are exposed from the back surface 9y of the resin sealing body 9.

Then, in each product forming area, as shown in FIG. 35(a), the second surfaces 5y and recessed portions 6 of the leads 5 are covered with a plating layer 10. For example, the plating layer 10 is formed by an electrolytic plating method.

Next, as shown in FIG. 35(b), the lead frame LF and the resin sealing body 9 are diced along a cutting line 18 into individual resin sealing bodies 9 by means of a dicing blade 37 for example. In this way the semiconductor device 1h of this eighth embodiment shown in FIGS. 30 and 31 is completed.

Thus, the same effects as in the first embodiment are obtained also in this eighth embodiment.

Ninth Embodiment

In this ninth embodiment, a description will be given of an example of application of the present invention to a QON (Quad Out-line Non-leaded Package) in which a chip support 7 is exposed to a main surface 9x of a resin sealing body 9.

Figure 37:
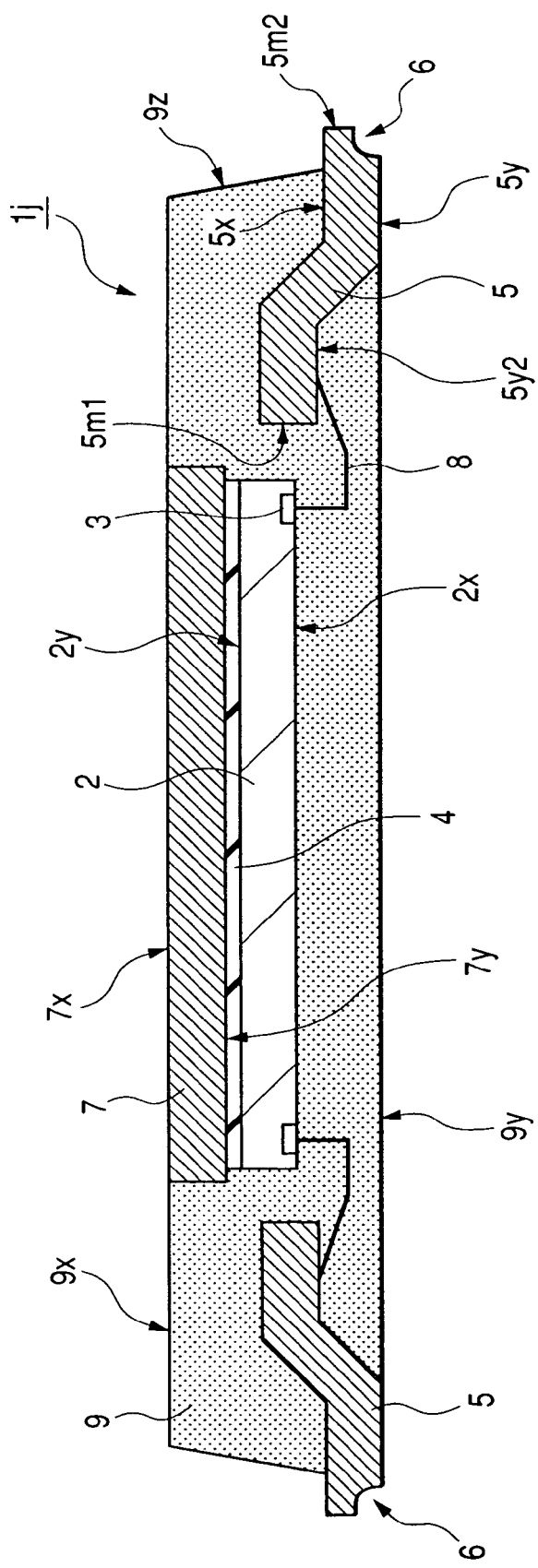
FIG. 37 is a schematic sectional view showing an internal structure of a semiconductor device according to a ninth embodiment of the present invention.

FIG. 37 is a schematic sectional view showing an internal structure of a semiconductor device according to a ninth embodiment of the present invention.

In the semiconductor device of this ninth embodiment, indicated at 1j, as shown in FIG. 37, a semiconductor chip 2 is mounted on a chip support 7 in such a manner that a main surface 2x of the chip is opposed to a back surface 9y of a resin sealing body 9. The chip support 7 is exposed to a main surface 9x of the resin sealing body 9. The chip support 7 is formed larger than the area of the main surface 2x of the semiconductor chip 2, whereby the heat dissipating performance can be improved. Electric connection between bonding pads 3 of the semiconductor chip 2 and leads 5 is effected through bonding wires 8. One ends of the bonding wires 8 are connected to the bonding pads 3 of the semiconductor chip 2, while opposite ends of the bonding wires opposite to the one ends are connected to back surfaces (third surfaces 5y2) of upset leads 5 at positions outside (around) the semiconductor chip 2. Also in such a QON type semiconductor device 1j there are obtained the same effects as in the first embodiment.

Although in this ninth embodiment the chip support 7 is larger than the area of the main surface 2x of the semiconductor chip 2, this constitutes no limitation. The chip support 7 may be smaller than the area of the main surface 2x of the semiconductor chip 2.

Although the present invention has been described above concretely on the basis of the above embodiments, it goes without saying that the present invention is not limited to the above embodiments, but that various changes may be made within the scope not departing from the gist of the invention.

For example, the present invention is applicable to an SON (Small Outline Non-leaded Package) which is a kind of a non-leaded semiconductor device.

What is claimed is:

1. A method of manufacturing a semiconductor device, comprising the steps of:

providing a lead frame including a semiconductor chip and leads, the semiconductor chip and the leads being sealed with a resin sealing body, wherein each of the leads has a first surface that extends inside and outside of the resin sealing body and that projects from a side face of the resin sealing body, and a second surface positioned opposite the first surface, the second surface being exposed from a back surface of the resin sealing body and having a plurality of recessed portions formed therein, the recessed portions being formed from the second surface toward the first surface and being spaced from each other along a projecting direction of the first surface;

forming a plating layer over the first surface outside the resin sealing body, the second surface, and an inner wall surface of the recessed portions of each of the leads, the plating layer being higher in solder wettability than each of the leads; and cutting each lead such that at least one recessed portion thereof and at least part of another recessed portion thereof are exposed from the resin sealing body after the cutting.

2. A method according to claim 1, wherein each said recessed portion is spaced apart from two side faces of the associated lead, the side faces being positioned on opposite sides, in a width direction, of the associated lead.

3. A method according to claim 1, wherein said first surface has a first portion covered by said resin sealing body and a second portion that projects outside said resin sealing body, and said plating layer is formed over said second portion.

4. A method according to claim 1, wherein said forming a plating layer is after forming the resin sealing body.

5. A method according to claim 1, wherein the lead frame is comprised of one of Cu, Cu alloy, and Fe—Ni, wherein the resin sealing body is comprised of a biphenyl-based thermosetting resin with a phenolic curing agent and silicone rubber and filler incorporated therein, and wherein the plating layer is comprised of Sn—Bi.

6. A method according to claim 1, wherein said cutting is performed such that two recessed portions of each lead are exposed from the resin sealing body after the cutting.

7. A method according to claim 1, wherein said cutting is performed such that two recessed portions and part of a third recessed portion of each lead are exposed from the resin sealing body after the cutting.

8. A method of manufacturing a semiconductor device, comprising the steps of:

providing a lead frame including leads, each lead having first and second surfaces positioned on opposite sides thereof and having a plurality of recessed portions formed therein, the recessed portions being formed from the second surface toward the first surface and being spaced from each other along a projecting direction of the first surface;

forming a resin sealing body which seals the leads partially, and from a back surface of which the second surfaces of the leads are exposed;

forming a plating layer over the first surface, the second surface, and an inner wall surface of the recessed portions of each of the leads, the plating layer being higher in solder wettability than each of the leads; and cutting each lead such that at least one recessed portion thereof and at least part of another recessed portion thereof are exposed from said resin sealing body after the cutting.

9. A method according to claim 8, wherein each said recessed portion is spaced apart from two side faces of the associated lead, the side faces being positioned on opposite sides, in a width direction, of the associated lead.

10. A method according to claim 8, wherein the lead frame further has a chip support, and said method further comprises the steps of:

bonding the semiconductor chip to the chip support; and electrically connecting electrodes of the semiconductor chip to respective ones of the leads through respective bonding wires.

11. A method according to claim 8, wherein said first surface has a first portion covered by said resin sealing body and a second portion that projects outside said resin sealing body, and said plating layer is formed over said second portion.

12. A method according to claim 8, wherein said forming a plating layer is after forming the resin sealing body.

13. A method according to claim 8, wherein the lead frame is comprised of one of Cu, Cu alloy, and Fe—Ni, wherein the resin sealing body is comprised of a biphenyl-based thermosetting resin with a phenolic curing agent and silicone rubber and filler incorporated therein, and wherein the plating layer is comprised of Sn—Bi.

14. A method of manufacturing a semiconductor device, comprising the steps of:

providing a lead frame including leads, each lead having first and second surfaces positioned on opposite sides thereof and having a plurality of recessed portions, the recessed portions being formed from the second surface toward the first surface and being spaced from each other along a projecting direction of the first surface;

forming a resin sealing body which seals the leads partially, and from a back surface of which the second surfaces of the leads are exposed;

forming a plating layer over the first surface, the second surface, and an inner wall surface of the recessed portions of each of the leads, the plating layer being higher in solder wettability than a second end face of each of the leads; and cutting the leads.

15. A method according to claim 14, wherein each recessed portion is spaced apart from two side faces of the associated lead, the side faces being positioned on opposite sides, in a width direction, of the associated lead.

16. A method according to claim 14, wherein said first surface has a first portion covered by said resin sealing body and a second portion that projects outside said resin sealing body, and said plating layer is formed over said second portion.

17. A method according to claim 14, wherein said forming a plating layer is after forming the resin sealing body.

18. A method according to claim 14, wherein the lead frame is comprised of one of Cu, Cu alloy, and Fe—Ni, wherein the resin sealing body is comprised of a biphenyl-based thermosetting resin with a phenolic curing agent and silicone rubber and filler incorporated therein, and wherein the plating layer is comprised of Sn—Bi.

19. A method of manufacturing a semiconductor device, comprising the steps of:

providing a lead frame including leads, each lead having first and second surfaces positioned on opposite sides thereof and having a plurality of recessed portions, the recessed portions being formed from the second surface toward the first surface and being spaced from each other along a projecting direction of the first surface;

forming a resin sealing body which seals the leads partially, and from a back surface of which the second surfaces of the leads are exposed;

forming a plating layer over the first surface, the second surface, and inner wall surfaces of the plural recessed portions in each of the leads, the plating layer being higher in solder wettability than a second end face of each of the leads; and cutting the leads such that at least one of the plural recessed portions in each of the leads is contiguous with a cut surface of the lead after the cutting.

20. A method according to claim 19, wherein each recessed portion is spaced apart from two side faces of the associated lead, the side faces being positioned on opposite sides, in a width direction, of the associated lead.

21. A method according to claim 19, wherein said first surface has a first portion covered by said resin sealing body and a second portion that projects outside said resin sealing body, and said plating layer is formed over said second portion.

22. A method according to claim 19, wherein said forming a plating layer is after forming the resin sealing body.

23. A method according to claim 19, wherein the lead frame is comprised of one of Cu, Cu alloy, and Fe—Ni, wherein the resin sealing body is comprised of a biphenyl-based thermosetting resin with a phenolic curing agent and silicone rubber and filler incorporated therein, and wherein the plating layer is comprised of Sn—Bi.

* * * * *